(12) United States Patent
Park et al.

(10) Patent No.: US 9,064,564 B2
(45) Date of Patent: Jun. 23, 2015

(54) VARIABLE RESISTIVE MEMORY DEVICE AND METHOD OF FABRICATING AND DRIVING THE SAME

(71) Applicant: SK hynix Inc., Gyeonggi-do (KR)

(72) Inventors: Nam Kyun Park, Seoul (KR); Gap Sok Do, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/766,593

(22) Filed: Feb. 13, 2013

(65) Prior Publication Data

US 2013/0223124 A1 Aug. 29, 2013

(30) Foreign Application Priority Data

Feb. 13, 2012 (KR) ........................ 10-2012-0014542

(51) Int. Cl.
| | |
|---|---|
| G11C 7/00 | (2006.01) |
| G11C 13/00 | (2006.01) |
| G11C 11/16 | (2006.01) |
| G11C 17/16 | (2006.01) |
| H01L 27/24 | (2006.01) |
| H01L 45/00 | (2006.01) |

(52) U.S. Cl.
CPC ............ *G11C 13/0004* (2013.01); *H01L 45/04* (2013.01); *H01L 45/16* (2013.01); *G11C 11/16* (2013.01); *G11C 17/16* (2013.01); *H01L 45/06* (2013.01); *H01L 45/085* (2013.01); *H01L 45/1233* (2013.01); *H01L 45/142* (2013.01); *H01L 45/143* (2013.01); *H01L 45/144* (2013.01); *H01L 45/146* (2013.01); *H01L 45/147* (2013.01); *H01L 45/1683* (2013.01); *H01L 27/2436* (2013.01); *H01L 27/2454* (2013.01); *H01L 27/2463* (2013.01); *H01L 27/2481* (2013.01); *G11C 13/0011* (2013.01); *G11C 13/0016* (2013.01)

(58) Field of Classification Search
CPC ............................... G11C 17/16; G11C 11/16
USPC ...................................... 365/96, 158
See application file for complete search history.

(56) References Cited

U.S. PATENT DOCUMENTS

| | | | |
|---|---|---|---|
| 7,764,534 B2 | 7/2010 | Thorp et al. | |
| 8,085,576 B2 * | 12/2011 | Hosono et al. | ................ 365/148 |
| 8,243,496 B2 * | 8/2012 | Kim | ............................. 365/148 |
| 8,389,968 B2 * | 3/2013 | Sekine et al. | ..................... 257/2 |
| 8,445,880 B2 * | 5/2013 | Park | ................................ 257/2 |
| 8,482,950 B2 * | 7/2013 | Kitagawa et al. | ............... 365/51 |
| 2009/0001337 A1 | 1/2009 | Furukawa et al. | |

* cited by examiner

*Primary Examiner* — Michael Tran
(74) *Attorney, Agent, or Firm* — IP & T Group LLP

(57) ABSTRACT

Provided are a variable resistive memory device, and methods of fabricating and driving the same. The variable resistive memory device includes a plurality of memory cells arranged in a first direction and in a second direction different from the first direction, each of the plurality of memory cells comprising a variable resistor and a selection device serially connected to the variable resistor. A common wiring is electrically connected to first ends of the plurality of memory cells to apply a common reference voltage. Each wiring line of a plurality of wiring lines is electrically connected to second ends of the plurality of memory cells arranged n the plurality of rows oriented in the first direction. A plurality of selection lines are respectively connected to the selection devices of the plurality of memory cells to select any one of the plurality of memory cells via the plurality of wiring lines.

37 Claims, 31 Drawing Sheets

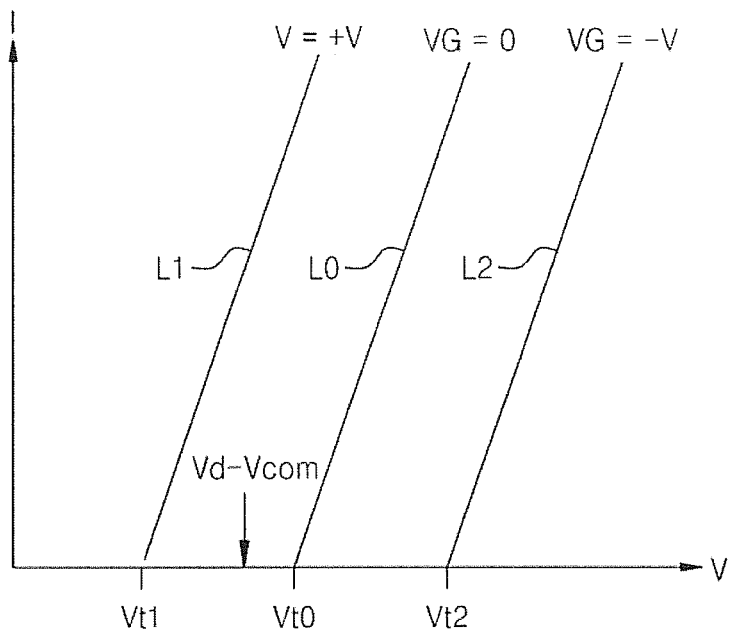

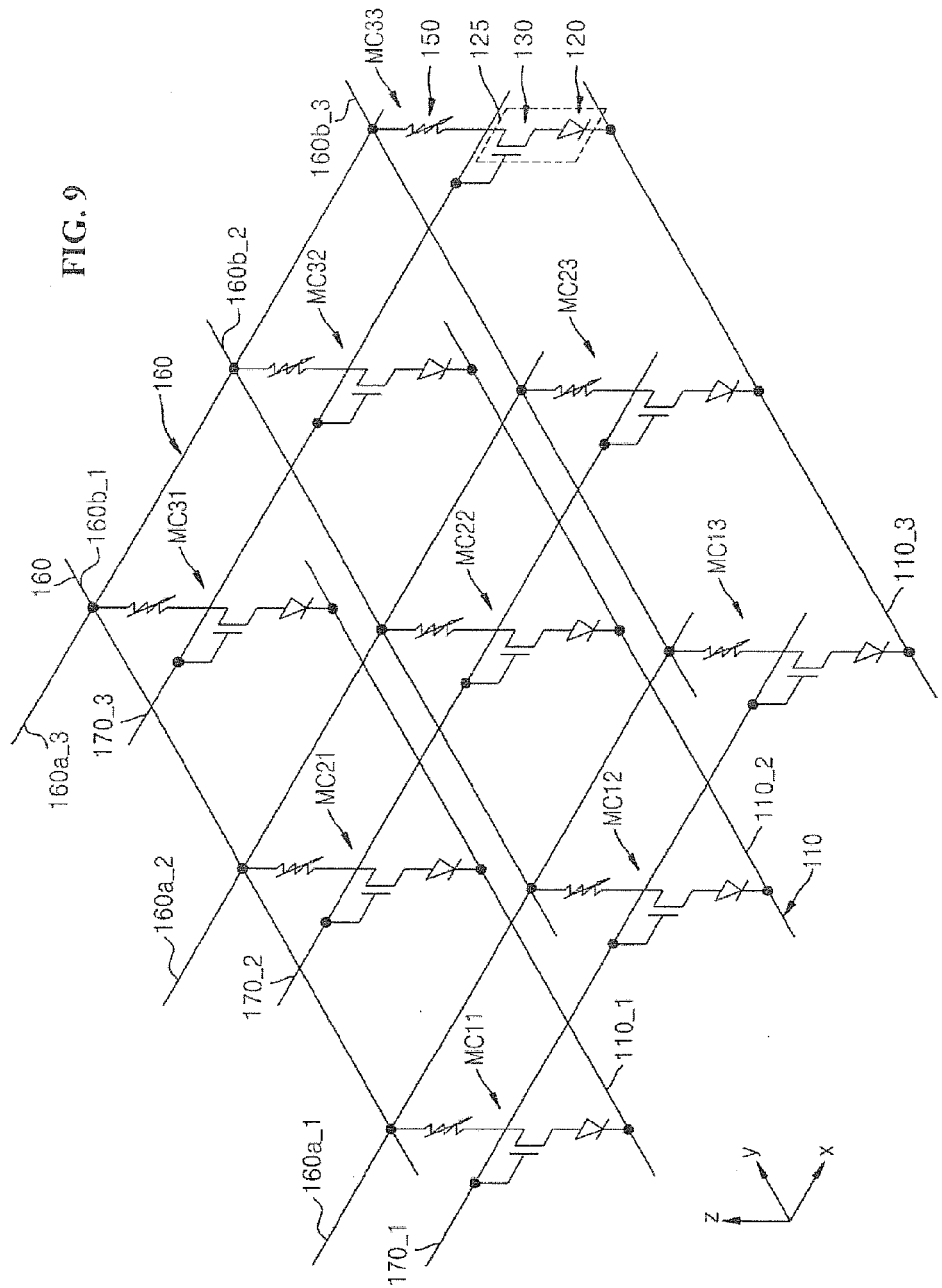

VARIABLE RESISTIVE MEMORY DEVICE AND METHOD OF FABRICATING AND DRIVING THE SAME

CROSS-REFERENCE TO RELATED PATENT APPLICATION

This application claims the benefit of Korean Patent Application No. 10-2012-0014542, filed on Feb. 13, 2012, in the Korean Intellectual Property Office, the disclosure of which is incorporated herein in its entirety by reference.

BACKGROUND OF THE INVENTION

1. Field of the Invention

The present invention relates to a memory device, and more particularly, to a variable resistive memory device, and methods of fabricating driving the same.

2. Description of the Related Art

As demands for portable digital application devices such as a digital camera, an MP3 player, a personal digital assistant (PDA), and a mobile phone have increased, the nonvolatile memory market has grown fast. High-density flash memory devices having low fabricating costs per bit are widely used as programmable nonvolatile memories. However, since flash memories require a relatively high capacity transistor in order to perform hot carrier injection for programming and a tunneling oxide film that is thick enough to endure a high internal voltage in order to ensure reliable data retention, there is a basic limitation in scaling down flash memories. As flash memories have recently reached their scaling limits, nonvolatile memory devices using a variable resistive material have attracted attention as alternative nonvolatile memories.

Since a variable resistive material has bi-stable resistance states that may be reversely changed by an electrical pulse applied thereto, and thus physical characteristics of the variable resistive material may be used as data, high-speed memory devices may be provided and may be easily scaled down.

SUMMARY OF THE INVENTION

According to an exemplary embodiment, there is provided a variable resistive memory device including: a plurality of memory cells arranged in a plurality of rows oriented in a first direction and in a second direction different from the first direction, each of the plurality of memory cells comprising a variable resistor and a selection device serially connected to the variable resistor; a common wiring electrically connected to ends of the plurality of memory cells to apply a common reference voltage; a plurality of wiring lines, wherein each wiring line, of the plurality of wiring lines, is electrically connected to other ends of the plurality of memory cells arranged only in the plurality of rows oriented in the first direction; and a plurality of selection lines respectively connected to the selection devices of the plurality of memory cells to select any one of the plurality of memory cells via the plurality of wiring lines.

According to an exemplary embodiment, there is provided a variable resistive memory device including: a plurality of memory cells arranged in a first direction and a second direction different from the first direction, each of the plurality of memory cells comprising a variable resistor and a selection device serially connected to the variable resistor; a first common wiring electrically connected to first ends of the plurality of memory cells and applying a reference voltage; a second common wiring electrically connected to second ends of the plurality of memory cells and applying a operating voltage; and first and second selection lines, the first and second selection lines coupled to a selection device of the plurality of memory cells to independently select one of the plurality of memory cells.

According to an exemplary embodiment, there is provided a variable resistive memory device including: a plurality of memory cells arranged in a matrix, each of the plurality of memory cells comprising a variable resistor and a selection device serially connected to the variable resistor; first wiring lines electrically connected to ends of the plurality of memory cells in a first direction; second wiring lines electrically connected to other ends of the plurality of memory cells in a second direction that is different than the first direction; and a common selection line coupled to the selection devices of the plurality of memory cells to apply a same voltage to the first wiring lines and to the second wiring lines.

According to an exemplary embodiment, there is provided a method of fabricating a variable resistive memory device, the method comprising forming a first wiring layer on a substrate; forming a sacrificial layer on the first wiring layer, the sacrificial layer having a first opening through which a surface of a portion of the first wiring layer is exposed; forming a pillar structure in the first opening, the pillar structure comprising a variable resistor and semiconductor regions providing a junction; removing the sacrificial layer to form a second opening through which a side wall of the pillar structure is exposed; forming a gate insulating film on the exposed surfaces of the semiconductor regions; forming a gate electrode on the gate insulating film, wherein the gate electrode is coupled to any one region of the semiconductor regions and is disposed in the second opening; forming an insulating layer to fill the second opening; and forming a second wiring layer on the insulating layer so that the second wiring layer contacts a top surface of the pillar structure.

According to an exemplary embodiment, there is provided a method of driving a variable resistive memory device comprising a plurality of memory cells, each memory cell comprising a variable resistor and a selection device serially connected to the variable resistor and being arranged in a first direction and a second direction different from the first direction, wherein the selection device comprises a plurality of semiconductor regions and an insulated gate structure coupled to any one of the semiconductor regions, the method comprising applying a common reference voltage to ends of the plurality of memory cells; applying, in the first direction, an operating voltage to other ends of the plurality of memory cells, the plurality of memory cells including a selected memory cell, the operating voltage being selected so that a voltage difference between the common reference voltage and the operating voltage is less than a specified reference threshold voltage of the semiconductor regions; applying a non-selection voltage to turn off the semiconductor regions to the other ends of the plurality of memory cells, in the first direction, with the exception of the selected memory cell; applying, in a second direction, a selection voltage to a corresponding insulated gate structure to swing a threshold voltage of the semiconductor regions of memory cells, of the plurality of memory cells, including the selected memory cell, so that the memory cells have a threshold voltage less than the specified reference threshold voltage; and applying a non-selection voltage to a corresponding insulated gate structure so that the semiconductor regions of the memory cells, having the selection voltage applied in the second direction, do not include the selected memory cell and have a threshold voltage equal to or greater than the specified reference threshold voltage.

According to an exemplary embodiment, there is provided a method of driving a variable resistive memory device comprising a plurality of memory cells, each memory cell comprising a variable resistor and a selection device serially connected to the variable resistor and being arranged in a first direction and a second direction different from the first direction, wherein the selection device comprises semiconductor regions and first and second insulated gate structures, the semiconductor regions comprise first and second conductive regions providing a junction therebetween and an intermediate region disposed between the first and second conductive regions, and the first and second insulated gate structures are coupled to the intermediate region and are independently controlled, and respectively extend in the first direction and the second direction, the method comprising applying a common reference voltage to ends of the plurality of memory cells; applying a common operating voltage to other ends of the plurality of memory cells, the common operating voltage being selected so that a voltage difference between the common reference voltage and the common operating voltage is less than a specified reference threshold voltage of the semiconductor regions; applying a selection voltage to corresponding first and second insulated gate structures connected in the first direction and the second direction comprising the selected memory cell from among the plurality of memory cells to swing a threshold voltage of the semiconductor regions so that the plurality of memory cells have a threshold voltage equal to or less than the reference threshold voltage; and applying a non-selection voltage to first and second insulated gate structures other than the corresponding first and second insulated gate structures connected to the selected memory cell so that the non-selected memory cells, of the plurality of memory cells, have a threshold voltage equal to or greater than the specified reference threshold voltage.

BRIEF DESCRIPTION OF THE DRAWINGS

The above and other features and advantages of the present invention will become more apparent by describing in detail exemplary embodiments thereof with reference to the attached drawings in which:

FIG. 4C is a graph illustrating a relationship between a current and a voltage in each of the selection devices of FIGS. 4A and 4B.

FIG. 9 is a circuit diagram illustrating a variable resistive memory device according to an exemplary embodiment.

DETAILED DESCRIPTION OF THE INVENTION

Figure 1:
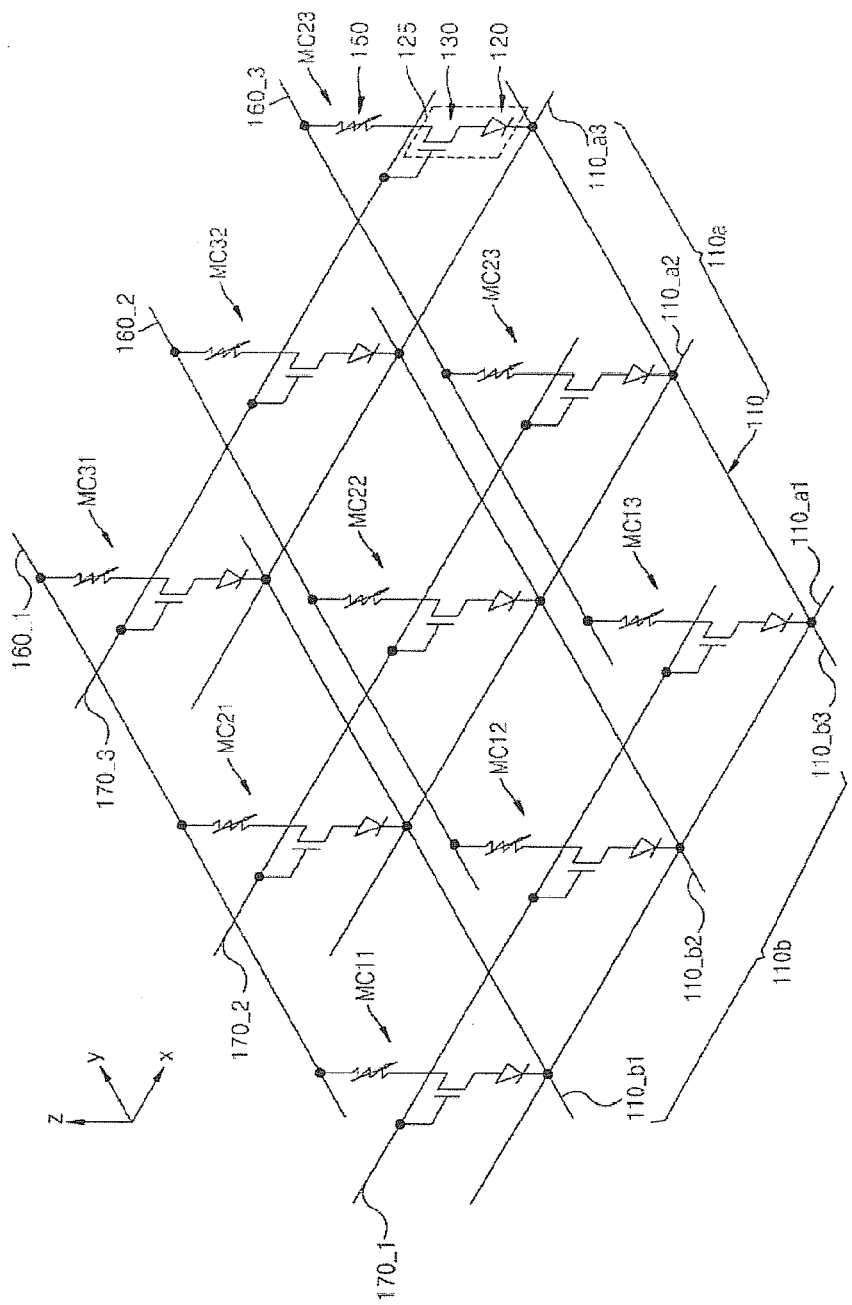
FIG. 1 is a circuit diagram illustrating a variable resistive memory device according to an exemplary embodiment.

The present invention will now be described more fully with reference to the accompanying drawings, in which exemplary embodiments of the invention are shown.

Hereinafter, the present invention will be described more fully with reference to the accompanying drawings, in which exemplary embodiments of the invention are shown. The invention may, however, be embodied in many different forms and should not be construed as being limited to the embodiments set forth herein; rather these embodiments are provided so that this disclosure will be thorough and complete, and will fully convey the concept of the invention to one of ordinary skill in the art.

In the drawings, the same reference numerals denote the same elements. As used herein, the term "and/or" includes any and all combinations of one or more of the associated listed items.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" used herein specify the presence of stated features, integers, steps, operations, members, components, and/or groups thereof, but do not preclude the presence or addition of one or more other features, integers, steps, operations, members, components, and/or groups thereof.

It will be understood that when an element or layer is referred to as being "formed on," another element or layer, it can be directly or indirectly formed on the other element or layer. That is, for example, intervening elements or layers may be present. Also, it will be understood by one of ordinary skill in the art that when an element is referred to as being "adjacent to" or "disposed adjacent to" another element, it may overlap with the other element or may be disposed under the other element.

In the description, relative terms such as "below," "above," "upper," "lower," "horizontal," and "vertical," should be construed to refer to the orientation as then described or as shown in the drawing under discussion. It will be understood that these relative terms are intended to encompass different orientations of a device in use or operation in addition to the orientation depicted in the drawings.

The embodiments of the present invention will be explained with reference to cross-sectional views illustrating desired embodiments (and intermediate structures) of the present invention. In the drawings, sizes and shapes of members may be exaggerated for clarity and convenience, and modifications of the shapes may be made in reality. Accordingly, the embodiments of the present invention are not limited to specific shapes of regions illustrated in the specification. Also, reference numerals of members in the drawings denote the same members throughout.

The term "substrate" used herein includes a supporting structure such as silicon, silicon-on-insulator (SOI), or silicon-on-semiconductor (SOS), a semiconductor layer formed on a supporting structure other than a semiconductor, a doped or undoped semiconductor layer, and a modified semiconductor layer. Also, the terms "supporting structure" and "semiconductor" are not limited to a silicon-based material and collectively refer to carbon, a polymer, silicon-germanium, germanium, a group III-V semiconductor material such as a gallium-arsenic-based compound, a group II-VI semiconductor material, or a mixed semiconductor material.

The terms "row" and "column" used herein refer to relative positions. For example, the expression "arranged in rows" may mean "arranged in a first direction" and the expression "arranged in columns" may be mean "arranged in a second direction". In this case, the first direction and the second direction may have a predetermined angle therebetween or may be parallel to each other. The expression "arranged in rows" used herein refers to, for example, "arranged in an x-direction" and the term "arranged in columns" used herein refers to, for example, "arranged in a y-direction".

FIG. 1 is a circuit diagram illustrating a variable resistive memory device according to an exemplary embodiment.

Referring to FIG. 1, the variable resistive memory device may include a plurality of memory cells MC11 through MC33 that are arranged in a first direction, for example, an x-direction, and a second direction, for example, a y—direction, first common wirings 110a and 110b, and second wiring lines 160_1, 160_2, and 160_3 (collectively referred to by reference numeral 160). The plurality of memory cells MC11 through MC33 may be provided between the first common wirings 110a and 110b (collectively referred to as common wiring 110) and (collectively denoted by reference numeral 110b) and the second wiring lines 160. [The sub-lines are defined below.]

The first common wiring 110 may be a common word line, and the second wiring lines 160_1, 160_2, and 160_3 may be bit lines. In contrast, the first common wirings 110a and 110b may be common bit lines, and the second wiring lines 160_1, 160_2, and 160_3 may be word lines.

The first common wiring 110 may include first sub-lines 110_a1, 110_a2, and 110_a3, which extend in the x-direction, and second sub-lines 110_b1, 110_b2, and 110_b3, which extend in the y-direction. The first common wiring 110b may cross the first sub-lines 110_a1, 110_a2, and 110_a3 and be electrically connected to the first sub-lines 110_a1, 110_a2, and 110_a3. In this case, the first common wiring 110 may have a lattice structure, and may have an equipotential by being electrically connected to one another. The equipotential may be a reference potential or a ground potential when a memory cell is driven, and may be interchangeably used with a common reference voltage.

The lattice structure of the first common wiring 110 is exemplary. The first common wiring 110 may include an appropriate conductive structure that has any one from among first sub-lines and second sub-lines and electrically connects the first sub-lines and the second sub-lines to have an equipotential therebetween. Alternatively, the first common wiring 110 may have a honeycomb structure or a continuous planar structure instead of a lattice structure or a linear structure, which will be explained below in detail with reference to FIGS. 2A and 3A.

According to an exemplary embodiment, ends of the plurality of memory cells MC11 through M33 may be connected to the first common wiring 110, and may have the same potential. Thus, since the first common wiring 110, which provides the same potential and increases an area of a conductive member for forming the first common wiring 110 in the same plane, a resistance of the first common wiring 110 may be reduced. As a result, voltage drop and delay of a signal for driving a selection device connected to each of memory cells may be reduced. Accordingly, according to an exemplary embodiment, a word line bounce (i.e., a performance variation according to positions in an array of a selected memory cell, due to voltage drop caused by a resistance of a conventional wiring having a linear pattern) may be reduced or suppressed.

Other ends of the plurality of memory cells MC11 through M33 may be connected to any one of the second wiring lines 160_1, 160_2, or 160_3. For example, first memory cells MC11, MC21, and MC31, second memory cells MC12, MC22, MC32, and third memory cells MC12, MC22, MC32 may be respectively connected to the second wiring lines 160_1, 160_2, or 160_3, which extend in the y-direction and are spaced in parallel apart from one another.

A programming or readout voltage (hereinafter, referred to as an operating voltage) may be applied to a wiring line connected to the other end of a memory cell to be selected from among the second wiring lines 160_1, 160_2, or 160_3, and another wiring line connected to the other ends of non-selected memory cells may be grounded or a voltage (hereinafter, referred to as a non-selection voltage) for keeping selection devices of the non-selected memory cells turned off may be applied along with a reference voltage to the another wiring line. For example, the non-selection voltage may be the same voltage as a ground voltage or a voltage that enables a selection device to be kept in a reverse bias state, which will be explained below in detail with reference to FIG. 5.

Each of the plurality of memory cells MC11 through MC33 may include a selection device 125, and a variable resistor 150 serially connected to the selection device 125. The selection device 125 may be coupled to any one of selection lines 170_1, 170_2, or 170_3 for selecting a memory cell. The selection device 125 may include semiconductor regions 120 that provide at least one semiconductor junction, as will be described below, and an insulated gate structure 130 that is coupled to any one region of the semiconductor regions 120 in order to form an electric field. The gate structure 130 may be coupled to any one of the selection lines 170_1, 170_2, or 170_3. The selection lines 170_1, 170_2, and 170_3 may extend in the first direction (i.e. the x—direction) to cross the second wiring lines 160_1, 160_2, and 160_3.

The semiconductor regions 120 may perform equivalently to diodes, but the present embodiment is not limited thereto and the semiconductor regions 120 may provide a conductive channel structure. The insulated gate structure 130 coupled to the semiconductor regions 120 swings a threshold voltage of the semiconductor regions 120, which will be explained below in detail with reference to FIG. 4C.

The variable resistor 150 may include an antifuse material, a fuse material, a phase-change material, a switchable unipolar or bipolar conductive bridging (or filament) material, a switchable polymer, a programmable metallization cell (PMC) material, or a magnetoresistance effect material. The variable resistor 150 may have two or more resistance states, and may perform a multi-bit operation, such as a 2-bit operation or a three or more-bit operation.

Figure 2A:
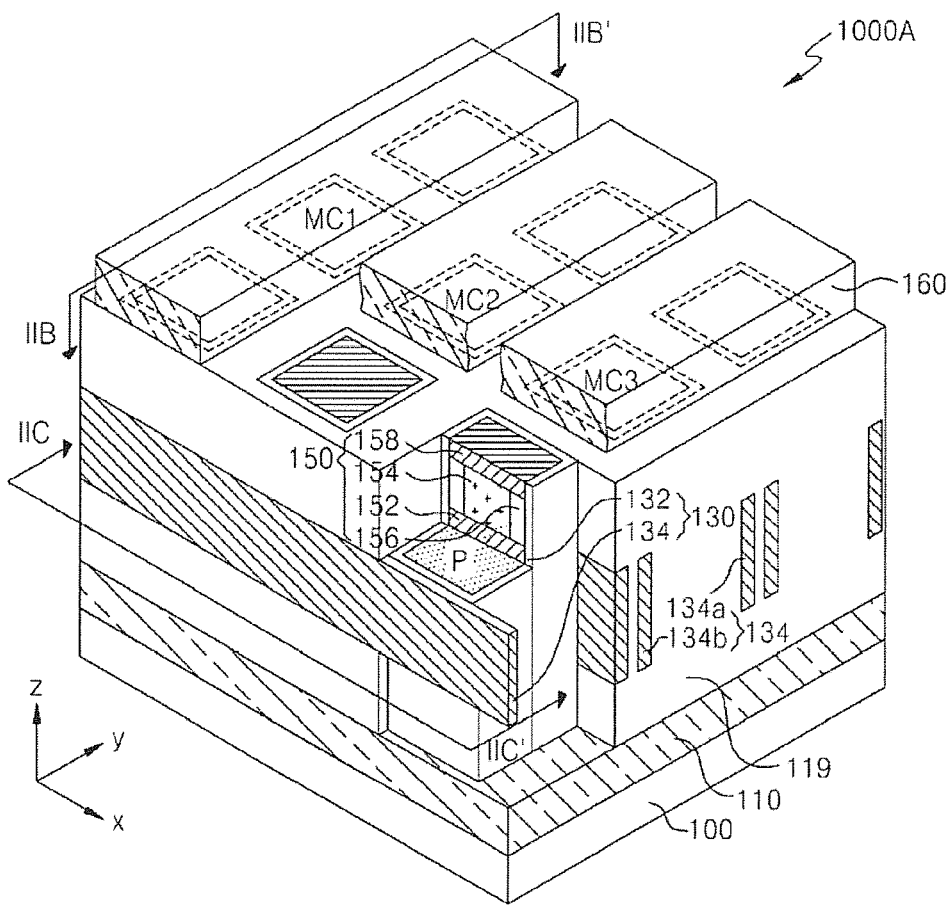
FIG. 2A is a partially cut-away perspective view illustrating a variable resistive memory device having the circuit diagram of FIG. 1.
Figure 2B:
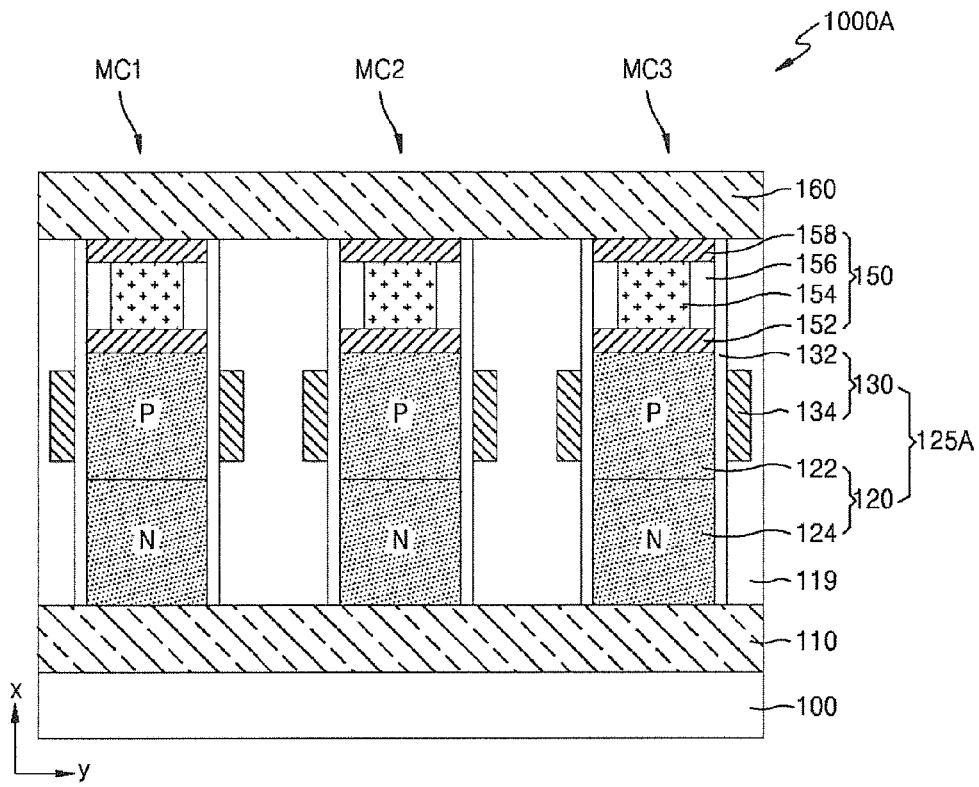
FIG. 2B is a vertical cross-sectional view taken along line IIB-IIB' of FIG. 2A.
Figure 2C:
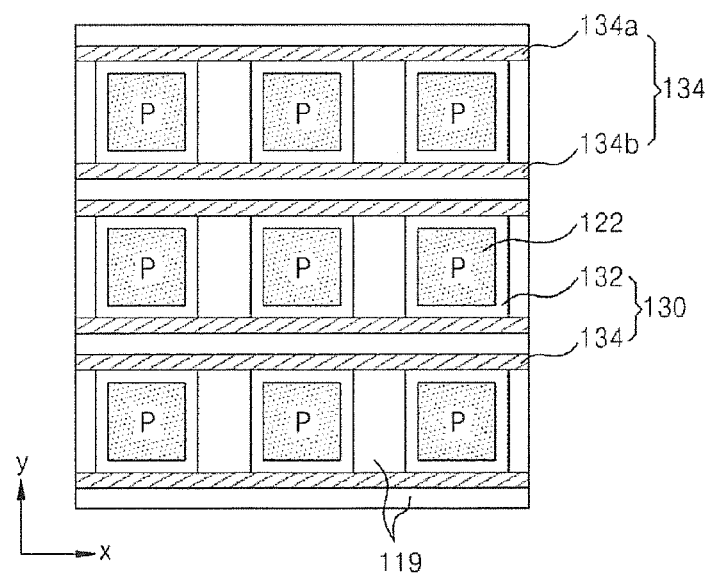
FIG. 2C is a horizontal cross-sectional view taken along line IIC-IIC' of FIG. 2A.

FIG. 2A is a partially cut-away perspective view illustrating a variable resistive memory device 1000A having the circuit diagram of FIG. 1. FIG. 2B is a vertical cross-sectional view taken along line IIB-IIB' of FIG. 2A. FIG. 2C is a horizontal cross-sectional view taken along line IIC-IIC' of FIG. 2A. FIGS. 2A through 2C illustrate a part of an exemplary memory cell array region, and circuit elements, such as high-voltage transistors and low-voltage transistors, and wirings for electrically connecting the high-voltage transistors and the low-voltage transistors, constituting a peripheral region adjacent to the memory cell array region.

Referring to FIGS. 2A and 2B, the variable resistive memory device 1000A includes the first common wiring 110 (110a and 110b), the second wiring lines 160 (160_1, 160_2, and 160_3) of FIG. 1 formed on a substrate 100, and a plurality of memory cells (e.g., MC1 through MC3) arranged between the first common wiring 110 and the second wiring lines 160.

Figure 3A:
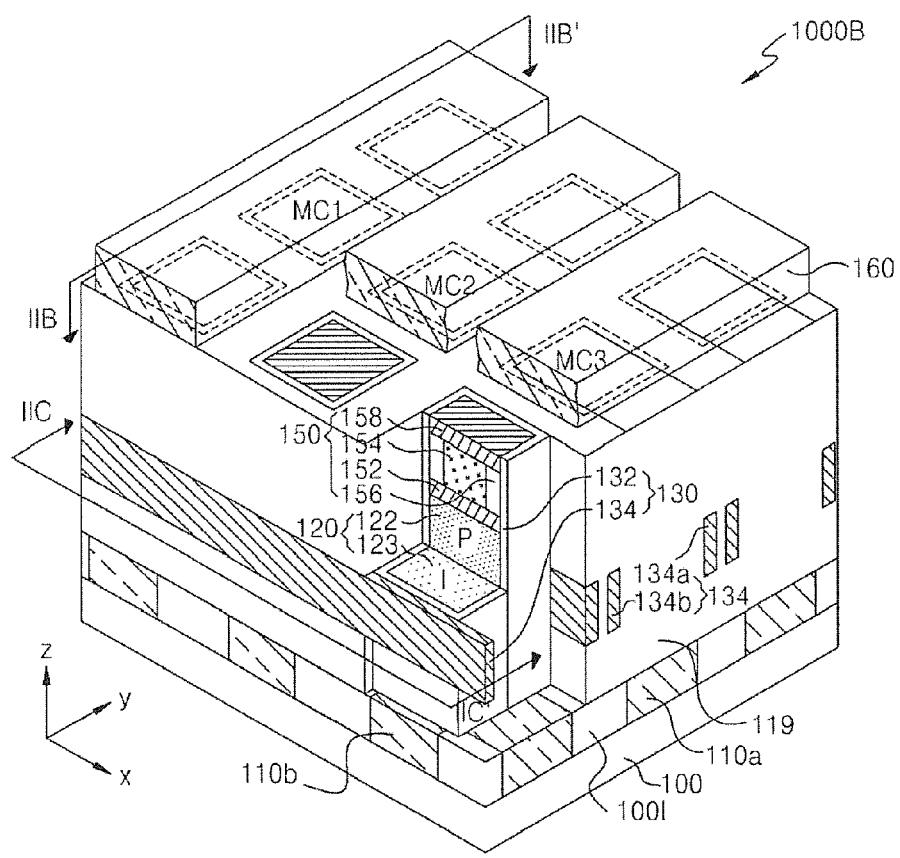
FIG. 3A is a partially cut-away perspective view illustrating a variable resistive memory device having the circuit diagram of FIG. 1.

The first common wiring 110 may include a high-density impurity region formed by using ion implantation in an active region defined by an isolation film 100I (see FIG. 3A), or may include a heavily doped polysilicon pattern layer, or a metal wiring pattern layer, formed on the substrate 100. The metal wiring pattern layer may be formed by patterning aluminum, copper, tungsten, an alloy thereof, or a conductive film, such as conductive metal oxide or metal nitride. The first common wiring 110 may have a continuous conductive planar structure as shown in FIG. 2A. Alternatively, the first common wiring 110 may have a lattice pattern as shown in FIG. 3A. In any case, the first common wiring 110 applies a common voltage to one ends of the plurality of memory cells MC1 through MC3.

The second wiring lines 160 may extend in the y-direction and be coupled to the other ends of the plurality of memory cells MC1 through MC3. The second wiring lines 160 may include a metal wiring pattern layer or a heavily doped polysilicon pattern layer.

Each of the plurality of memory cells MC1 through MC3 may include the selection device 125 and the variable resistor 150 serially connected to the selection device 125. The plurality of memory cells MC1 through MC3 may have a pillar structure formed perpendicular to a surface of the substrate 100. Alternatively, by changing a direction of a wiring structure, the plurality of memory cells MC1 through MC3 may be horizontally formed on the substrate 100, or may have a three-dimensional (3D) structure in which a horizontal direction and a vertical direction are combined. Also, although an upper portion of the pillar structure may have a rectangular cross-sectional shape as shown in FIG. 2A, the shape of the pillar structure is not limited thereto. For example, the upper portion of the pillar structure may have a circular cross-sectional shape, an elliptical cross-sectional shape, or a polygonal cross-sectional shape such as a pentagonal shape or a hexagonal shape.

The selection device 125 may include a PN diode structure including the semiconductor regions 120, for example, first and second conductive regions 122 and 124 having different conductivity types, and the insulated gate structure 130 coupled to the PN diode structure as shown in FIG. 2B.

Each of the first and second conductive regions 122 and 124 may have, for example, a single crystal structure, a polycrystalline structure, or an amorphous structure, but is not limited thereto. Each of the first and second conductive regions 122 and 124 may include a group IV material, such as carbon, silicon, silicon-germanium, or germanium, a group III-V semiconductor material, such as a gallium-arsenic-based compound, a group II-VI semiconductor material, a mixed semiconductor material, a semiconducting polymer, or a metal-oxide-semiconductor.

The first conductive region 122 includes, for example, a P-type impurity region, and the second conductive region 124 includes, for example, an N-type impurity region having a conductivity type different from that of the first conductive region 122. The first conductive region 122 and the second conductive region 124 provide a PN junction. Alternatively, the first conductive region 122 may include an N-type impurity region and the second conductive region 124 may include a P-type impurity region. In this case, the PN diode structure with a reversed polarity may be serially connected to the insulated gate structure 130 in FIG. 1.

The insulated gate structure 130 may include a gate insulating film 132 and a gate electrode 134, and may be coupled to the first conductive region 122 from among the semiconductor regions 120. However, the present embodiment is not limited thereto, and the insulated gate structure 130 may be coupled to the second conductive region 124. That is, a selection device 125A includes three terminals, that is, the first conductive region 122, the second conductive region 124, and the insulated gate structure 130.

The gate insulating film 132 may include, for example, a silicon oxide film, a silicon nitride film, a high-k insulating film, such as $Al_2O_3$, $TiO_2$, $La_2O_3$, $Ta_2O_3$, $Y_2O_3$ or $HfO_2$, or a stacked structure thereof. Materials of the gate insulating film 132 are exemplary and are not limited thereto. Other perovskite-based materials may be used as materials of the gate insulating film 132. The gate electrode 134 may include an appropriate conductor, for example, a heavily doped polysilicon layer, a metal layer, such as aluminum or tungsten, a metal silicide layer, or a metal nitride layer.

Figure 3B:
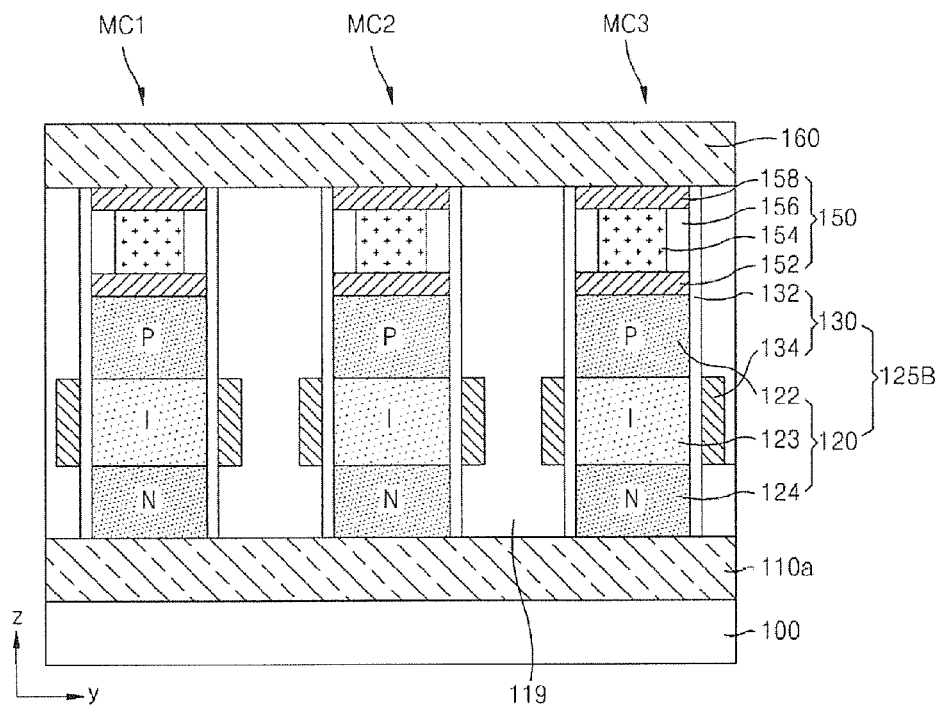
FIG. 3B is a vertical cross-sectional view taken along line IIIB-IIIB' of FIG. 3A.
Figure 3C:
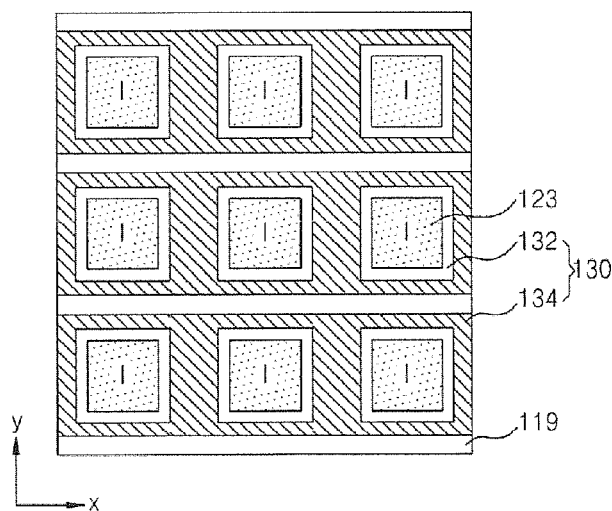
FIG. 3C is a horizontal cross-sectional view taken along line IIIC-IIIC' of FIG. 3A.

The gate electrode 134 of the insulated gate structure 130 may extend in a predetermined direction, for example, in the x-direction, as shown in FIG. 2C. Also, the gate electrode 134 may include a pair of gate electrodes 134a and 134b. The gate electrodes 134a and 134b may pass through both side walls of the first conductive regions 122. However, the gate electrodes 134a and 134b are not limited thereto. The gate electrode 134 may extend as a single element to pass through only one surface of the first conductive regions 122. Alternatively, the gate electrode 134 may extend to fill a space between memory cells that are adjacent in a predetermined direction, for example, the y-direction, and to surround the first conductive regions 122 as shown in FIG. 3C, but is not limited thereto as well.

The variable resistor 150 may include a first electrode 152, a second electrode 158, and a variable resistive layer 154 for storing information between the first electrode 152 and the second electrode 158. The variable resistor 150 may further include a spacer insulating film 156 disposed between a side wall of the variable resistive layer 154 and a sacrificial layer 112, however, the arrangement is not limited thereto. For example, positions of the variable resistive layer 154 and the spacer insulating film 156 may be exchanged. The spacer insulating film 156 may reduce a driving current by reducing a contact area between the first electrode 152 and the variable resistive layer 154 or reducing a programming volume of the variable resistive layer 154.

The variable resistive layer 156 may include a phase-change material layer, a switchable unipolar or bipolar conductive bridging (or filament) material, a switchable polymer, a programmable metallization cell (PMC), or a magnetoresistance effect material.

Examples of the phase-change material layer may include a chalcogenide-based compound such as a GeSbTe-based material. Examples of the conductive bridging material may include a perovskite-based oxide, such as $SrTiO_3$, $SrZrO_3$, or $Nb:SrTiO_3$, or a transition metal oxide such as $TiO_x$, NiO, $TaO_x$, $HfO_x$, $AlO_x$, $ZrO_x$, $CuO_x$, $NbO_x$, $TaO_x$, $GaO_x$, $GdO_x$, $MnO_x$, PrCaMnO, or $ZnONIO_x$. Also, examples of the PMC material may include an electrolyte material having super ion regions. The PMC material may exhibit switching characteristics or change a resistance by physically rearranging the super ion regions in the electrolyte material. The electrolyte material having the super ion regions may be a base glass material, such as geranium selenium (GeSe). The GeSe may be referred to as a chalcogenide glass or a chalcogenide material. Examples of the GeSe compound include $Ge3Se_7$, $Ge_4Se_6$, or $Ge_2Se_3$. Alternatively, other well-known materials such as cadmium sulfide (CdS) may be used. Examples of the magnetoresistance effect material may be well-known materials applied to a giant magnetoresistive memory or a spin torque transfer magnetoresistive random-access memory (STT-MRAM).

Alternatively, the variable resistive layer 156 may be formed of an antifuse material, a fuse material, or a switchable polymer material. However, as long as a material has hysteresis that affects a current due to ions or electrons in a micro structure suitable for a nonvolatile memory, the material may be used. For example, the variable resistive layer 156 may be formed of a material such as a well-known polymer-based material, a polymer thin film including nanoscale metal particles dispersed in the polymer-based material, graphene, or carbon nanotubes.

Each of the materials of the variable resistive layer 156 may have a single-layer structure or a stacked structure. The stacked structure may have two or more resistance states, and thus may perform a multi-bit operation such as a 2-bit operation or a three or more-bit operation.

Each of the first and second electrodes 152 and 158 of both ends of the variable resistive layer 156 may be a single metal layer, or may have a stacked structure further including an additive layer such as a barrier layer, an adhesion layer, or an ohmic contact layer. Each of the first and second electrodes 152 and 158 may include platinum (Pt), tungsten (W), gold (Au), palladium (Pd), rhodium (Rh), iridium (Ir), ruthenium (Ru), tantalum (Ta), titanium (Ti), molybdenum (Mo), chromium (Cr), vanadium (V), zirconium (Zr) lead (Pb), a nitride thereof, or an oxide thereof. The barrier layer may include, for example, Ti, Ta, or a nitride thereof. Also, the adhesion layer may include, for example, Ti, Ti nitride, Ta, Ta nitride, or W nitride.

When the variable resistive layer 156 is formed of the PMC material, any one of the first electrode 152 and the second electrode 158 may be an anode and the other may be a cathode. In this case, the anode may include an electrochemically active metal, that is, a reactive metal, such as silver (Ag), tellurium (Te), copper (Cu), nickel (Ni), or zinc (Zn). Also, the cathode may include a relatively non-reactive metal such as W, Au, Pt, Pd, Rh, Ir, Ru, Ti, Ta, Mo, Cr, V, a nitride thereof (e.g., TiN), or a silicide thereof (e.g., TiSi).

Any one of the first or second electrode layers 152 and 158 may be omitted by being integrated with the second wiring lines 160. Also, the second electrode layer 158 may be individually formed for each of the memory cells MC1, MC2, and MC3 as shown in FIGS. 2A and 2B, or may have a linear pattern along the second wiring lines 150.

The second wiring lines 160, which are coupled to the plurality of memory cells MC1, MC2, and MC3, may be a metal pattern layer formed by patterning Al, Cu, W, an alloy thereof, or a conductive film, such as a conductive metal oxide or a conductive metal nitride. Alternatively, the second wiring lines 160 may include a heavily doped polysilicon pattern layer.

The plurality of memory cells MC1 through MC3, the first common wiring 110, and the second wiring lines 160 may be electrically separated from one another by one or more interlayer insulating films 119. Some of the interlayer insulating films 119 may be used as mold insulating films for forming the plurality of memory cells MC1 through MC3 and/or the second wiring lines 160, which will be explained below with reference to FIGS. 6A through 6M.

FIG. 3A is a partially cut-away perspective view illustrating a variable resistive memory device 1000B having the circuit diagram of FIG. 1. FIG. 3B is a vertical cross-sectional view taken along line IIIB-IIIB' of FIG. 3A. FIG. 3C is a horizontal cross-sectional view taken along line of FIG. 3A. For elements denoted by the same reference numerals as those in FIGS. 2A through 2C, the previous explanation may be referred to and a repeated explanation thereof will not be given.

Referring to FIGS. 3A and 3B, a selection device 1258 has a PIN diode structure provided by three semiconductor regions, that is, the first and second conductive regions 122 and 124 and an intermediate region 123. The semiconductor regions 120 may provide the PIN diode structure by using the first conductive region 122, which may be a P-type impurity region, the second conductive region 124, which may be an N-type impurity region having a conductivity type different from that of the first conductive region 122, and the intermediate region 123, which may be an intrinsic semiconductor region or a lightly doped region. The insulated gate structure 130 may be coupled to the intermediate region 123 from among the semiconductor regions 120. That is, the selection device 125B may be a device including three terminals, that is, the first conductive region 122, the second conductive region 124, and the insulated gate electrode 130.

Alternatively, although not shown in FIG. 3A, the first conductive region 122 and the second conductive region 124 may be respectively N-type and P-type impurity regions. In this case, the PIN diode structure with a reversed polarity may be serially connected to the variable resistor 130 in FIG. 1.

The gate electrode 134 of the insulated gate structure 130 may extend in a predetermined direction, for example, the x-direction as shown in FIG. 3C. Also, the gate electrode 134 may extend as a single element to fill a space between adjacent memory cells which are adjacent in the y-direction and to surround the intermediate region 123. Alternatively, the gate electrode 134 may extend to pass through only one surface of the intermediate region 123 or may include two gate electrodes and the two gate electrodes may pass through both side surfaces of the intermediate region 123 as described with reference to FIG. 2C.

Figure 4A:
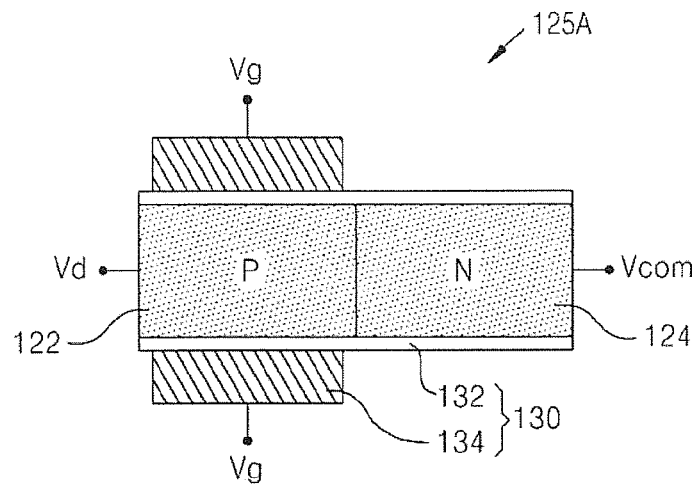
FIGS. 4A and 4B are cross-sectional views illustrating exemplary selection devices.
Figure 4B:
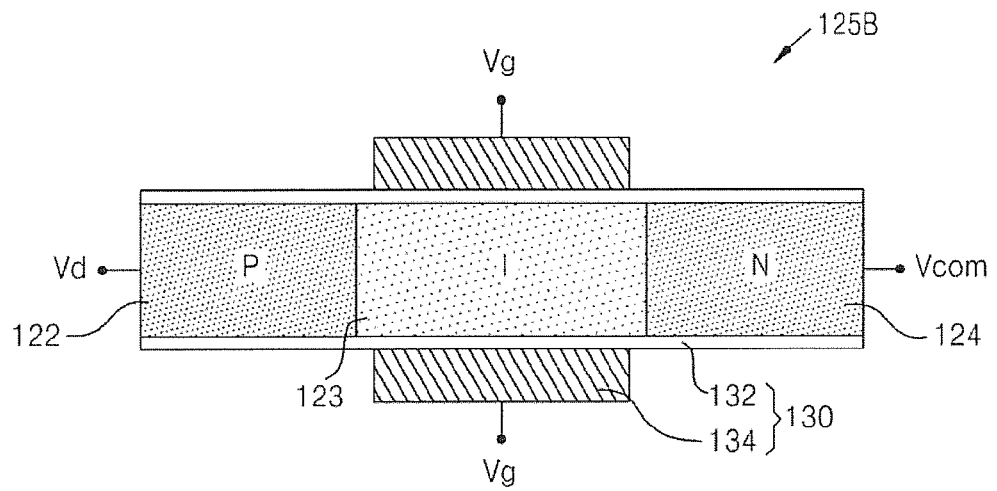
Figure 5:
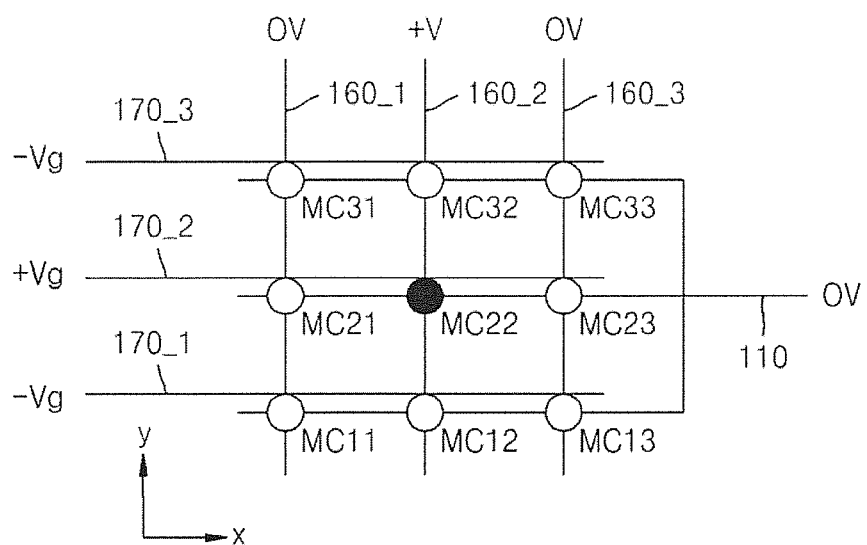
FIG. 5 is a circuit diagram for explaining a method of driving the variable resistive memory device of FIG. 1 using any of the selection devices of FIGS. 4A and 4B.

FIGS. 4A and 4B are cross-sectional views illustrating the selection devices 125A and 125B according to embodiments of the present invention. FIG. 4C is a graph illustrating a relationship between a current and a voltage in each of the selection devices 125A and 125B. FIG. 5 is a circuit diagram for explaining a method of driving the variable resistive memory device of FIG. 1 using any of the selection devices 125A and 125B.

Referring to FIG. 4A, the selection device 125A may include a PN diode structure provided by the semiconductor regions 120 as described with reference to FIG. 2A. For example, the first and second conductive regions 122 and 124 may respectively include a P-type semiconductor region and an N-type semiconductor region. The insulated gate structure 130 may be provided on the first conductive region 122.

The insulated gate structure 130 may include the gate insulating film 132 formed on the first conductive region 122 and the gate electrode 134 insulated from the first conductive region 122 by the gate insulating film 132. The gate insulating film 132 may be formed only on the first conductive region 122 or may partially extend to the second conductive region 124. Alternatively, although not shown in FIG. 4A, the insulated gate structure 130 may be provided on the second conductive region 124 which may be an N-type impurity region, not on the first conductive region 122.

The insulated gate structure 130 may be formed on one surface or a plurality of surfaces of a corresponding region. Alternatively, the insulated gate structure 130 may surround a surface of the first conductive region 122. The insulated gate structure 130 in FIG. 4A is formed on or surrounds both surfaces of the first conductive region 122.

Referring to FIG. 1, along with FIG. 4A, an end portion of the selection device 125A at the first conductive region side may be connected to the variable resistor 150, and an end portion of the selection device 125A at the second conductive region side may be connected to the first common wiring 110. The insulated gate structure 130 may be connected to corresponding selection lines 170_1, 170_2, and 170_3. The gate electrode 134 may be integrated with any of the corresponding selection lines 170_1, 170_2, or 170_3.

The insulated gate structure 130 may be connected to the corresponding selection lines 170_1, 170_2, or 170_3, and may adjust a current-voltage curve by reducing or increasing a threshold voltage of the PN diode structure according to a polarity of an applied voltage. For example, a threshold voltage of the PN diode structure may be reduced by applying a predetermined voltage to the insulated gate structure 130 of a predetermined memory cell, and thus the PN diode structure may be switched from an OFF state to an ON state under a voltage applied between the first common wiring 110 and the second wiring lines 160. As a result, the corresponding memory cell for programming or readout may be selected. Characteristics and advantages of such a method of selecting a predetermined memory cell will be explained below with reference to FIGS. 4C and 5.

In the PN diode structure, when a voltage is applied to the gate electrode 134, a magnitude of a current flowing through the PN diode structure may be increased. For example, when a positive (+) voltage is applied to the gate electrode 134 coupled to the P-type conductive region 122, the first conductive region 122 which is a P-type region may be in a depletion mode, and a PN junction may be moved toward the first conductive region 122. At the same time, the number of electrons which are minority carriers may be increased in the PN diode structure, the PN diode structure may have a resistance less than that before a bias voltage is applied to the gate electrode 134, and thus an ON current flowing through the PN diode structure may be increased. In this case, since a large current may be obtained even with a low operating voltage, a device may be minimized, and when an operation requiring a large current such as a programming operation is performed, reliability may be improved.

Referring to FIG. 4B, the selection device 125B may include a PIN diode structure provided by the semiconductor regions 120 which form a junction. The semiconductor regions 120 may include the first conductive region 122, which may be a P-type impurity region, the second conductive region 124, which may be an N-type impurity region having a conductivity type different from that of the first conductive region 122, and the intermediate region 123, which may be a lightly doped impurity region or an intrinsic region disposed between the first conductive region 122 and the second conductive region 124. In this case, the first conductive region 122 and the intermediate region 123 may provide a P-I semiconductor junction, and the second conductive region 124 and the intermediate region 123 may provide an I—N semiconductor junction.

The insulated gate structure 130 may be provided on the intermediate region 123. The gate insulating film 132 may be disposed only on the intermediate region 123, or may extend to the first and second conductive regions 122 and 124 as shown in FIG. 4B. The gate electrode 134 may be disposed on the intermediate region 123 to be eccentric toward any one of the first conductive region 122 and the second conductive region 124, to concentrate an electric field on any one of the P-I junction and the I-N junction.

The gate electrode 134 may be formed on one surface of the intermediate region 123. Optionally, the gate electrode 134 may be formed on two or more surfaces, or may surround a surface of the intermediate region 123. The insulated gate structure 130 of FIG. 48 is formed on, or surrounds, both surfaces of the intermediate region 123.

Referring to FIG. 1 along with FIG. 4B, an end portion of the selection device 125B at the first conductive region side may be connected to the variable resistor 150, and an end portion of the selection device 125B at the second conductive region side may be connected to the first common wiring 110. Alternatively, an end portion of the selection device 125B at the first conductive region side may be connected to the first common wiring 110 and an end portion of the selection device 125B at the second conductive region side may be connected to the variable resistor 150. The insulated gate structure 130 of the selection device 125B may be connected to corresponding selection lines 170. The gate electrode 134 may be integrated with any of the corresponding selection lines 170.

The insulated gate structure 130 may be connected to the corresponding selection lines 170, and thus the PIN diode structure may be switched from an OFF state to an ON state by applying an electric field to a position close to any one of a P-I semiconductor junction and an I-N semiconductor junction according to a polarity of an applied voltage. The PIN diode structure may be turned on due to avalanche breakdown in the intermediate region 123.

For example, assuming that the PIN diode structure is provided by the first conductive region 122, which is a P-type region, the intermediate region 123, which is an intrinsic or lightly doped region, and the second conductive region 124, which is an N-type region, and the insulated gate structure 130 is coupled to the intermediate region 123, as shown in FIG. 4B, if a positive voltage +V is applied to the gate electrode 134 (i.e., VG=+V; curve L1), when compared with a case where a bias voltage is not applied (i.e., Vg=0; curve L0), then a conduction band of the intermediate region 123 may be shifted to the negative side. Thus tunneling of majority carriers may easily occur around the P-I junction, thereby reducing a threshold voltage from Vt0 to Vt1. In contrast, if a negative voltage −V is applied to the gate electrode 134 (i.e., Vg=−V; curve L2), when compared with a case where VG=0 (curve L0), then a threshold voltage is increased from Vt0 to Vt2.

As such, the PIN diode structure may be switched irrespective of a voltage applied to both end portions of the PIN diode structure by adjusting a threshold voltage of a current-voltage curve of the PIN diode structure according to a polarity of a voltage applied to the insulated gate structure 130. Accordingly, any one cell may be selected from among the plurality of memory cells as shown in FIG. 5.

In detail, in FIG. 5, a specific memory cell MC 22 is selected from among the memory cells MC11 through MC33 of the variable resistive memory device of FIG. 1. For example, 0 V (=Vcom), which is a reference voltage, may be applied to the first common wiring 110, and 0 V, which is a non-selection voltage, may be applied to the second wiring lines 160_1 and 160_3 of the non-selected cells MC11, MC21, MC31, MC13, MC23, and MC33. A positive voltage Vd, which is an operating voltage, may be applied to the second wiring line 160_2 of the selected cell M22. In this case, it may be assumed that a voltage Vd is applied to a diode. In this case, the voltage Vd is applied to the selected memory cell MC22 and the non-selected memory cells MC12 and MC32 connected to the second wiring line 160_2. Also, when a negative voltage −V, which is a gate voltage Vg, is applied to the selection lines 170_1 and 170_3, to which the non-selected cells MC12 and MC32 are coupled, and a positive voltage +Vg is applied to the selection line 170_2 coupled to the selected cell MC22, as described with reference to FIG. 4C, only a threshold voltage of a selection device of the memory cell MC22 may be reduced to a level less than Vt0 (Vth=Vt1). The corresponding selection device may be turned on, and the memory cell MC22 may be selected. Programming or readout may be performed according to the operating voltage on the selected memory cell MC22. As such, according to an exemplary embodiment, since the insulated gate structure 130, coupled to each of the selection lines 170_1, 170_2, and 170_3, controls current-voltage characteristics of a selection device (i.e., swings a threshold voltage) a memory cell for programming or readout may be selected. Also, since a driving voltage is substantially reduced due to the selection device, an effective current for programming under the same driving voltage may be increased and a response speed may be increased. Also, due to the increase in the effective current, a peripheral circuit may be minimized and high integration may be achieved.

FIGS. 6A through 6M are cross-sectional views for explaining an exemplary method of fabricating the variable resistive memory device of FIG. 1. For elements previously denoted by the same reference numerals, the previous explanation may be referred to unless otherwise mentioned.

Figure 6A:
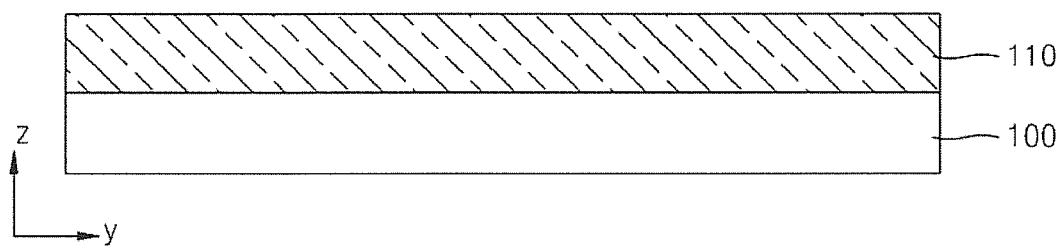
FIGS. 6A through 6M are cross-sectional views for explaining a method of fabricating the variable resistive memory device of FIG. 1.

Referring to FIG. 6A, a first wiring layer 110, for example, a first common wiring, is formed on the substrate 100. The first common wiring may have a linear pattern of a lattice structure or may be a conductive plane. The first common wiring may be formed by using a well-known process such as impurity implantation into an active region of the substrate 100, deposition, plating, or imprinting.

Figure 6B:
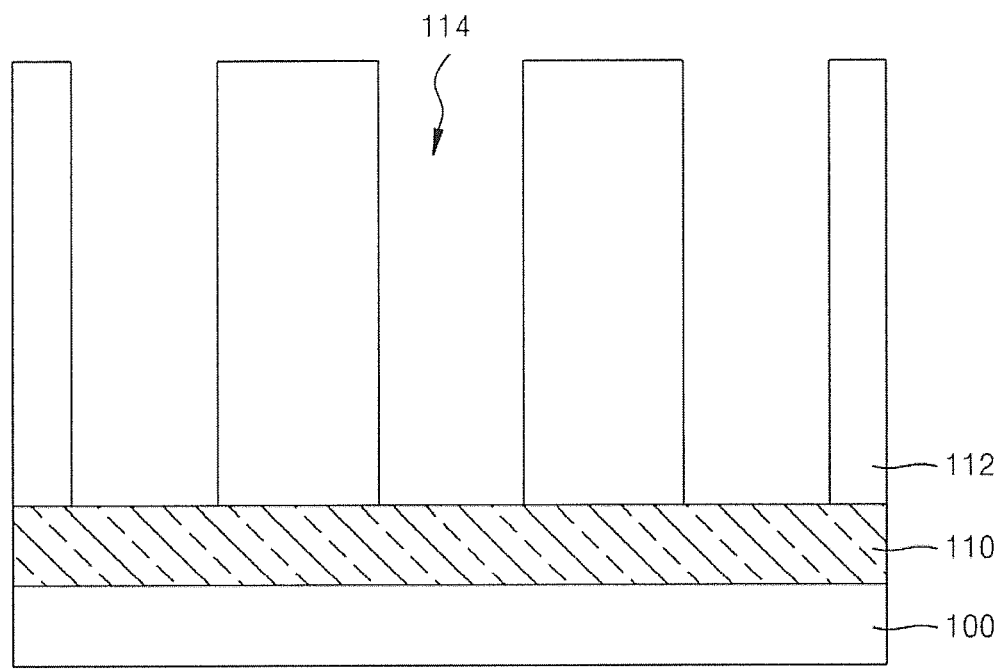

Referring to FIG. 6B, the sacrificial layer 112, including a first opening 114 through which a surface of a portion of the first wiring layer 110 is exposed, is formed on the first wiring layer 110. Thus, the sacrificial layer 112 is formed on the first wiring layer 110. The sacrificial layer 112 is may include at least one of silicon oxide, silicon nitride, or silicon oxynitride. The sacrificial layer 112 may be formed by using, for example, thermal oxidation, physical vapor deposition, chemical vapor deposition (CVD), or plasma enhanced CVD (PECVD). Next, the first opening 114 is formed by patterning the sacrificial layer 112.

Figure 6C:
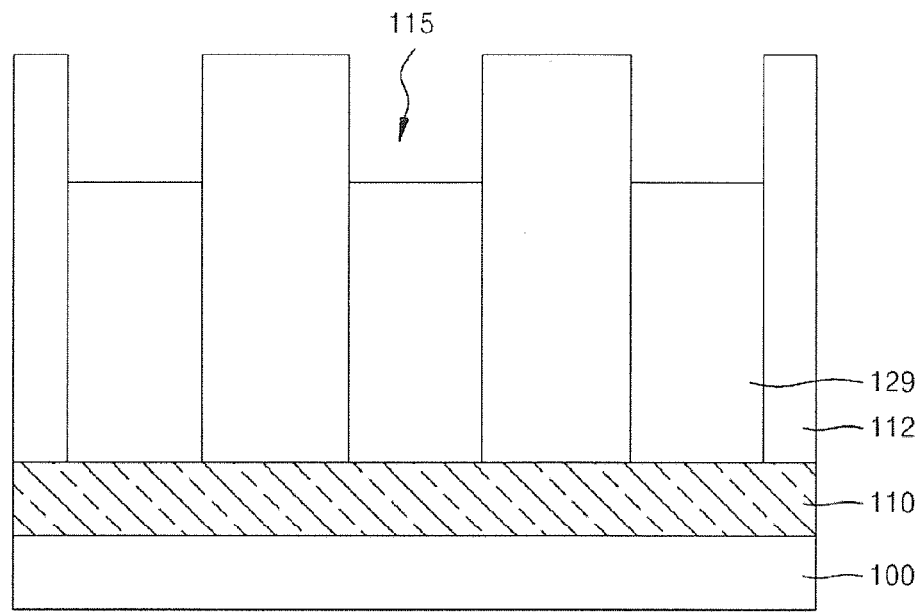

Next, the semiconductor regions 120 and the variable resistor 150, each having a pillar structure, are formed in the first opening 114. To this end, a diode structure electrically connected to the first wiring layer 110 may be formed on the substrate 100. Referring to FIG. 6C, a semiconductor layer 129 is formed in the first opening 114 of the sacrificial layer 112, and the semiconductor layer 129 is recessed in the first opening 114 by using etchback. When the first wiring layer 110 is a high-density impurity layer, the semiconductor layer 129 may be a single crystal layer formed by using selective epitaxial growth (SEG) or solid phase epitaxy (SPE). Alternatively, when the first wiring layer 110 is a metal layer, the semiconductor layer 129 may be a polysilicon layer.

Figure 6D:
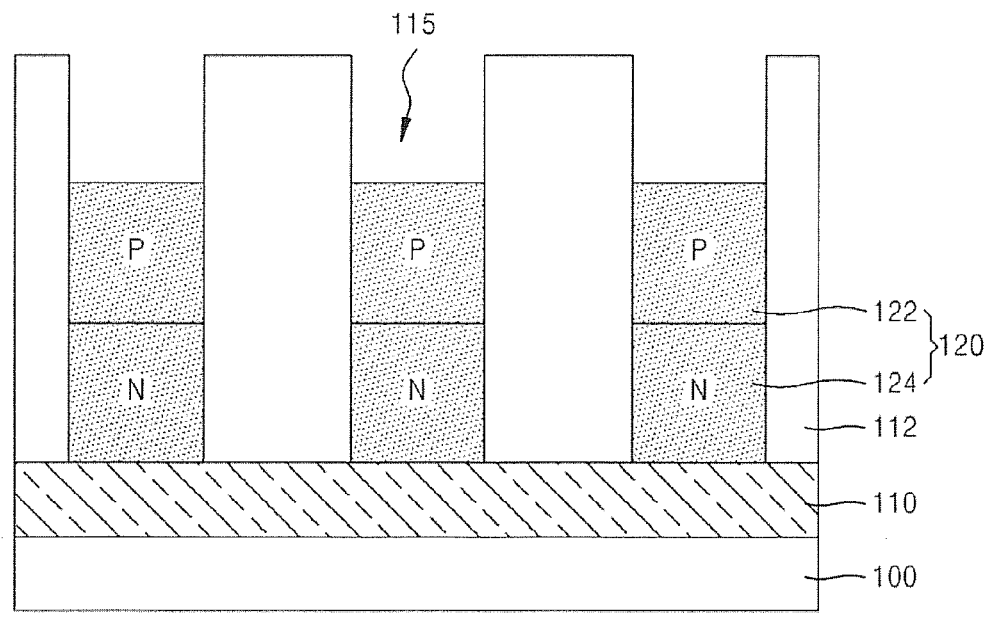
Figure 6E:
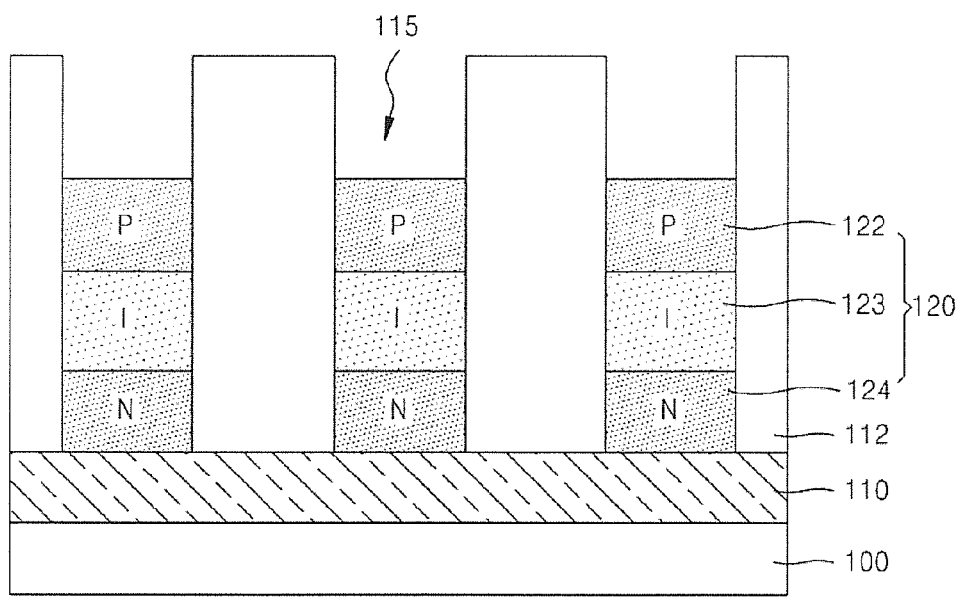

Referring to FIGS. 6D and 6E, the semiconductor regions 120 that form a junction may be formed by using in situ ion implantation in the semiconductor layer 129 or may be formed after the semiconductor layer 129 is deposited. Thus, a PN diode structure of FIG. 6D or a PIN diode structure of FIG. 6E may be formed in the first opening 114. If necessary, a thermal treatment may be performed in order to activate any of the PN or PIN diode structures. A first groove 115 may be defined in the sacrificial layer 112 due to any of the PN or PIN diode structures. The PIN diode structure will be explained with reference to drawings and the PN diode structure will be explained without drawings.

Figure 6F:
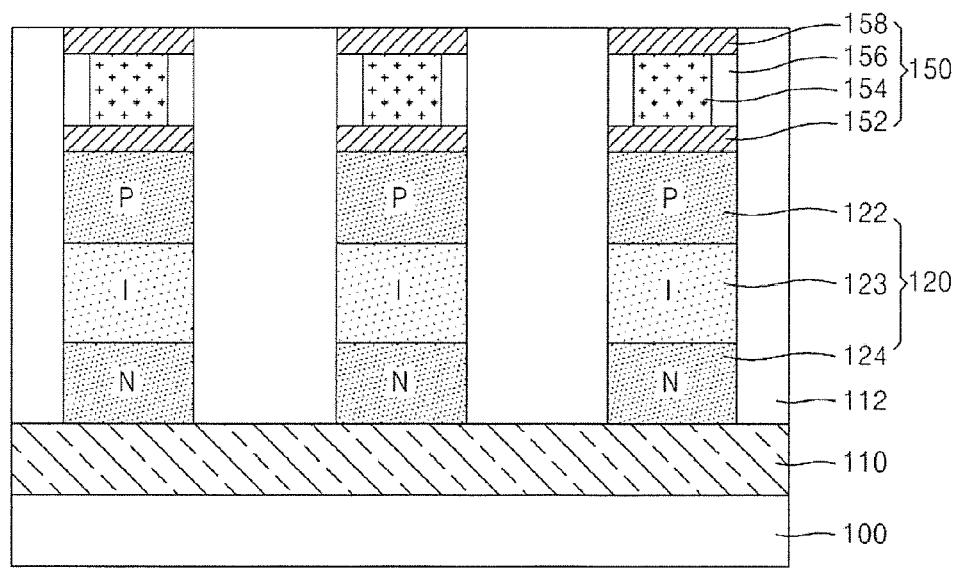

Referring to FIG. 6F, the variable resistor 150 is formed on each of the semiconductor regions 120 in the first groove 115. The first electrode 152 of the variable resistor 150 may be formed by filling the first groove 115 with an electrode material by using physical vapor deposition or CVD and recessing the electrode material to a predetermined thickness using etchback. Alternatively, the first electrode 152 may be locally formed is in the first groove 115 using a chemical reaction, such as silicidation of each of the semiconductor regions 120. The first electrode 152 may be a single metal layer as shown in FIG. 6F, or may have a multi-layer structure including an ohmic contact layer 20a, such as a metal layer, a barrier layer, an adhesion layer, or a silicide layer.

After the first electrode 152 is formed, the variable resistive layer 154 may be formed in the first groove 115. Referring to FIG. 6F, the spacer insulating film 156 may be further formed between the sacrificial layer 112 and a side wall of the variable resistive layer 154. Alternatively, positions of the variable resistive layer 154 and the spacer insulating film 156 may be exchanged.

The spacer insulating film 156 may be formed by forming an insulating film for a spacer in the first groove 115 and performing anisotropic etching such as plasma etching such that the insulating film for the spacer remains on a side wall of the first groove 115 and the first electrode 152 is exposed. The spacer insulating film 156 may include an oxide, a nitride, or an oxynitride. For example, the spacer insulating film 156 may include at least one of a silicon oxide a silicon nitride, or a silicon oxynitride.

The variable resistive layer 154 is formed on the first electrode 152 exposed by the spacer insulating film 156. After a variable resistive material layer is formed on the sacrificial film 112 to fill the first groove 115, the variable resistive layer 154 may be formed by performing a planarization process such as chemical mechanical polishing or an etchback process such as plasma etching. The planarization process or the etchback process may be excessively performed such that the variable resistive layer 154 is recessed to be under a surface of the sacrificial layer 112.

Next, the second electrode 158 may be formed on the variable resistive layer 154. Although the second electrode 158 is disclosed as being disposed in the first groove 115 of the sacrificial layer 112 in FIG. 6F, alternatively, the second electrode 158 may be disposed over the surface of the sacrificial layer 112 or may extend to the surface of the sacrificial layer 112. The second electrode 158 may be formed by using physical vapor deposition or CVD. The physical vapor deposition may be performed by using, for example, sputtering, electron beam ablation, or arc deposition.

The variable resistor 150 may include the first electrode 152, the variable resistive layer 154, the spacer insulating film 156, and the second electrode 158. Alternatively, the second electrode 158 may be coupled to the second wiring lines 160, or the second wiring lines 160 may share the second electrode 158. In this case, a process of forming the second electrode 158 may be performed when a process of forming the second wiring lines 160 (which will be explained below with reference to FIG. 6L) may be performed.

Figure 6G:
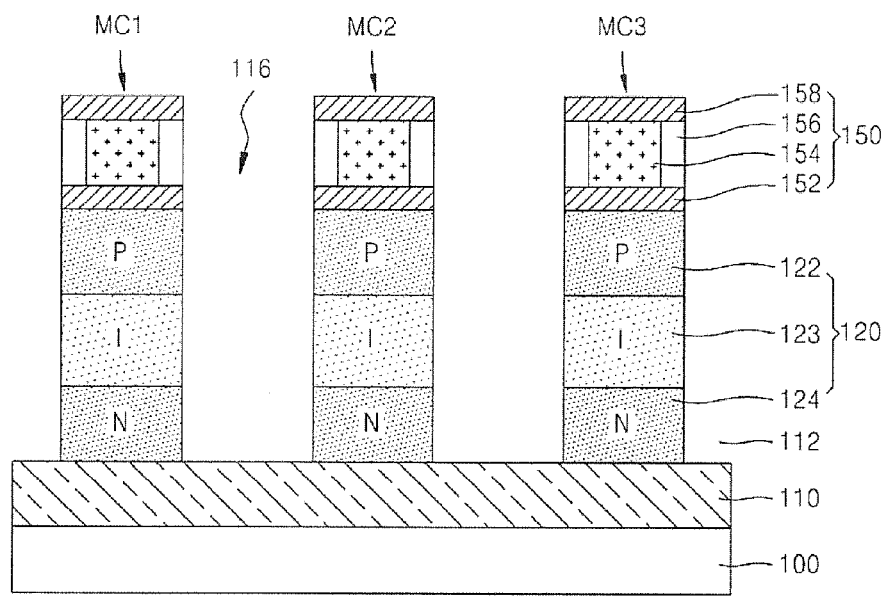

Referring to FIG. 6G, a second opening 116, through which a side wall of the pillar structure, including a surface of a side wall of each of the semiconductor regions 120, is exposed, may be formed by removing at least a part of the sacrificial layer 112 by using etchback or wet etching. The second opening 116 may have a trench structure. The trench structure may be a lattice structure passing between the pillar structures, or may have a linear pattern in which a part of the sacrificial layer 112 may remain in an extension direction of the second wiring lines 160 (i.e., the y-direction—see FIG. 3A), and the other part of the sacrificial layer 112 in the x-direction (perpendicular to the ground) may be removed, so that the opening 116 extends in parallel between memory cells that are adjacent in the x-direction. In this case, the trench structure may define a space where the gate electrode 134 of FIG. 2C or 3C is to be formed. Alternatively, a process of forming a step insulating film 117 may be omitted by etching the sacrificial layer 112 (which will be explained with reference to FIG. 6I) until only a portion corresponding to the step insulating film 117 remains.

Figure 6H:
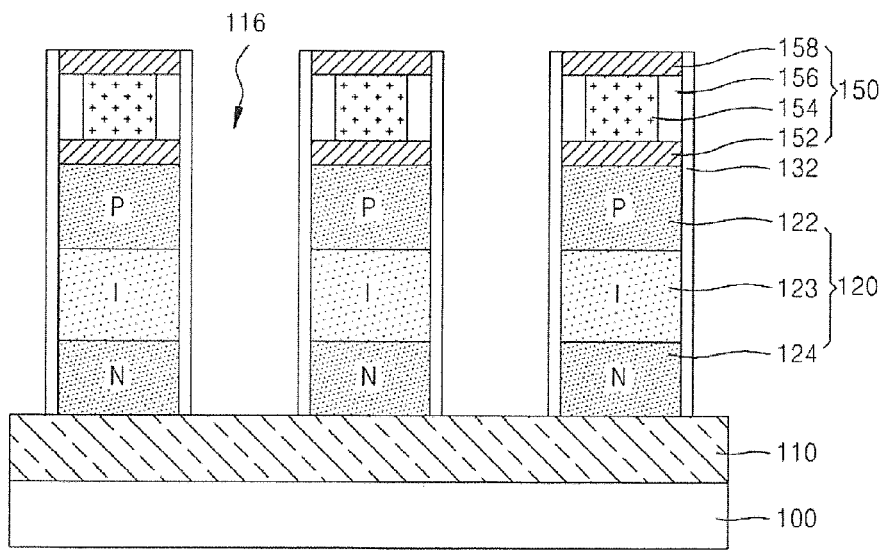

Referring to FIG. 6H, the gate insulating film film 132 is formed in the second opening 116. The gate insulating film 132 may be formed by using, for example, thermal oxidation, or CVD or atomic layer deposition having excellent step coverage. The gate insulating film 132 of FIG. 6H is formed by using CVD or atomic layer deposition. When the gate insulating film 132 is formed by using thermal oxidation, the gate insulating film 132 may be formed only on side walls of the semiconductor regions 120.

The gate insulating film 132 may be formed only on a side wall of the second opening 116. In this case, after an insulating film for a gate which covers the side wall of the second opening 116 and an exposed surface of the substrate 100 is formed, a surface of the substrate 100 or a surface of the first wiring layer 110 may be exposed by performing anisotropic etching on the insulating film for the gate as shown in FIG. 6H.

Figure 6I:
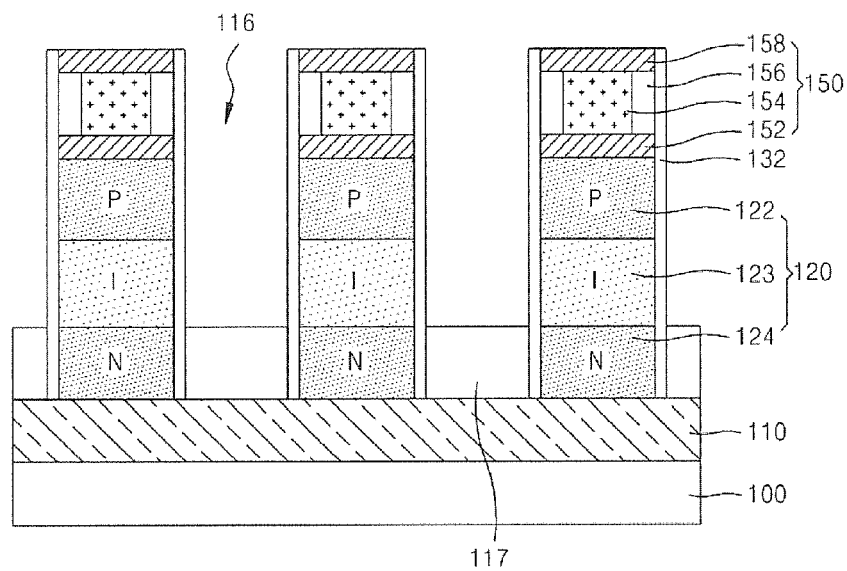

Referring to FIG. 6I, the step insulating film 117 is formed on a lower portion in the second opening 116. The step insulating film 117 is an insulating layer for adjusting a height of the gate electrode 134 (see FIG. 3A). In order to form the gate electrode 134 coupled to the intermediate region 123 of the PIN diode structure, the step insulating film 117 may fill the lower portion of the second opening 116 to expose the intermediate region 123. Although not shown in FIG. 6I, in order to couple the insulated gate structure 130 to the first conductive region 122, which is a P-type impurity region in the PN diode structure (as shown in FIG. 6D), the step insulating film 117 may fill the lower portion of the second opening 116 to a height at which a side surface of the first conductive region 122 is exposed. The insulating layer 117 may include an oxide, a nitride, or an oxynitride. For example, the insulating layer 117 may include at least one of a silicon oxide, a silicon nitride, or a silicon oxynitride.

Figure 6J:
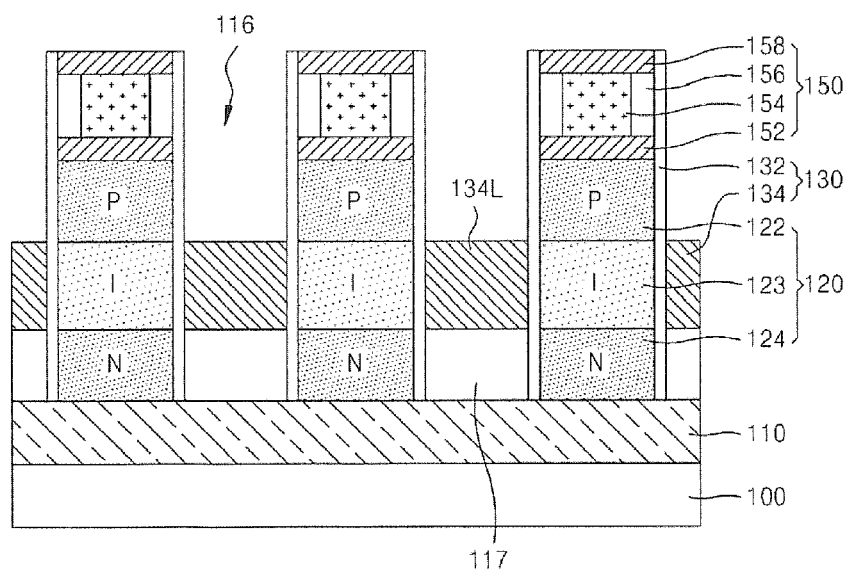

Referring to FIG. 6J, a conductive layer for a gate electrode 134L is formed on the step insulating film 117. To this end, a gate electrode material is formed on the step insulating film 117 to fill the second opening 116, the gate electrode material is recessed by using etchback or wet etching. Thus, the conductive layer for the gate electrode 134L has a height corresponding to a height of a side wall of the intermediate region 123.

Figure 6K:
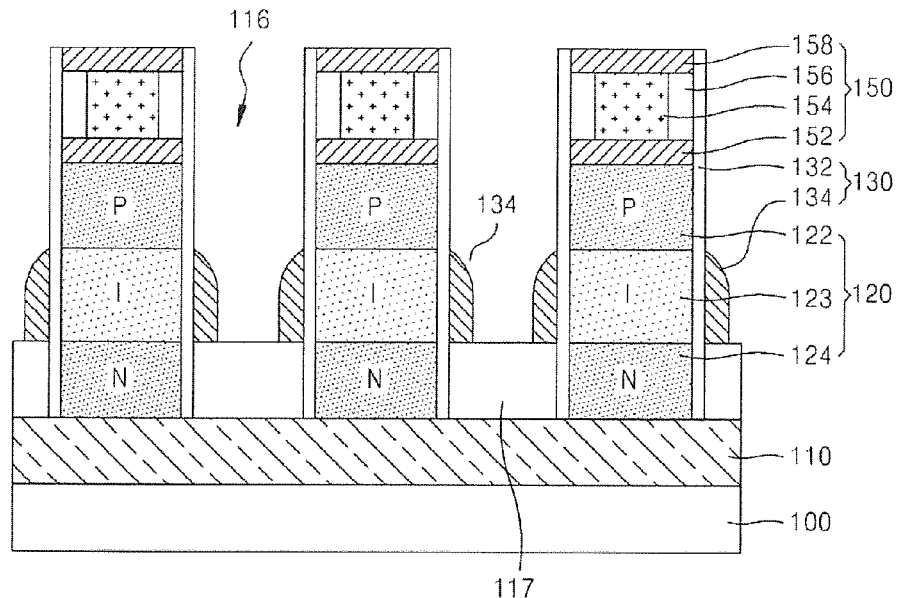

Referring to FIG. 6K, the gate electrode 134 may be formed as a spacer by using anisotropic etching. Although the gate electrode 134 is disclosed as being disposed on both side walls of the intermediate region 123 in FIG. 6K, alternatively (as described above with reference to FIG. 3C0, the gate electrode 134 may extend in the x-direction while surrounding the intermediate region 123 along a pattern of the second opening 116. Alternatively, the gate electrode 134 may be formed by forming a conductive layer for a gate electrode by using a process having excellent step coverage such as atomic layer deposition and patterning the conductive layer for the gate electrode, like the gate insulating film 132 described with reference to FIG. 6H.

Figure 6L:
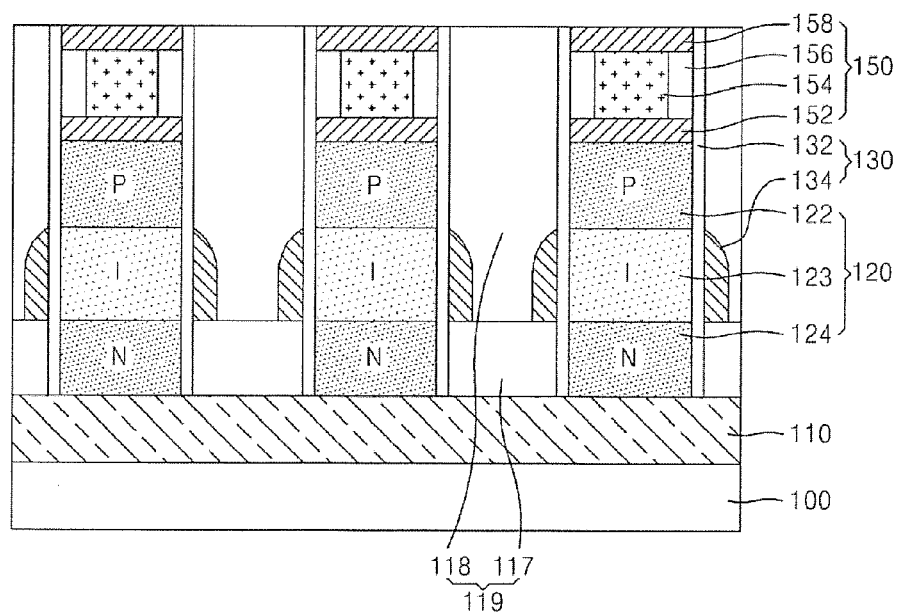

Referring to FIG. 6L, an insulating layer 118 is formed to completely cover the second opening 116. The insulating layer 118 separates the gate structure 134 and the variable resistors 150. The insulating layer 118 may include an oxide, a nitride, or an oxynitride. For example, the insulating layer 118 may include at least one of a silicon oxide, a silicon nitride, or a silicon oxynitride. The insulating layer 118 may include the same material as that of the step insulating layer 117. The insulating layer 118 and the step insulating film 117 may constitute the intermediate insulating layer 119 of the variable resistive memory device.

Next, as shown in FIG. 3A, a second wiring layer, for example, a second wiring layer 160, may be formed on a resultant structure. A process of forming the second wiring layer 160 may be performed by using damascene or dual damascene or photolithography. As described above, the second wiring layer 160 may be integrally formed with the second electrode 158 of the variable resistor 150. Alternatively, a process of forming the second electrode 158 may be omitted by allowing the second wiring layer 160 to share the second electrode 158.

Figure 6M:
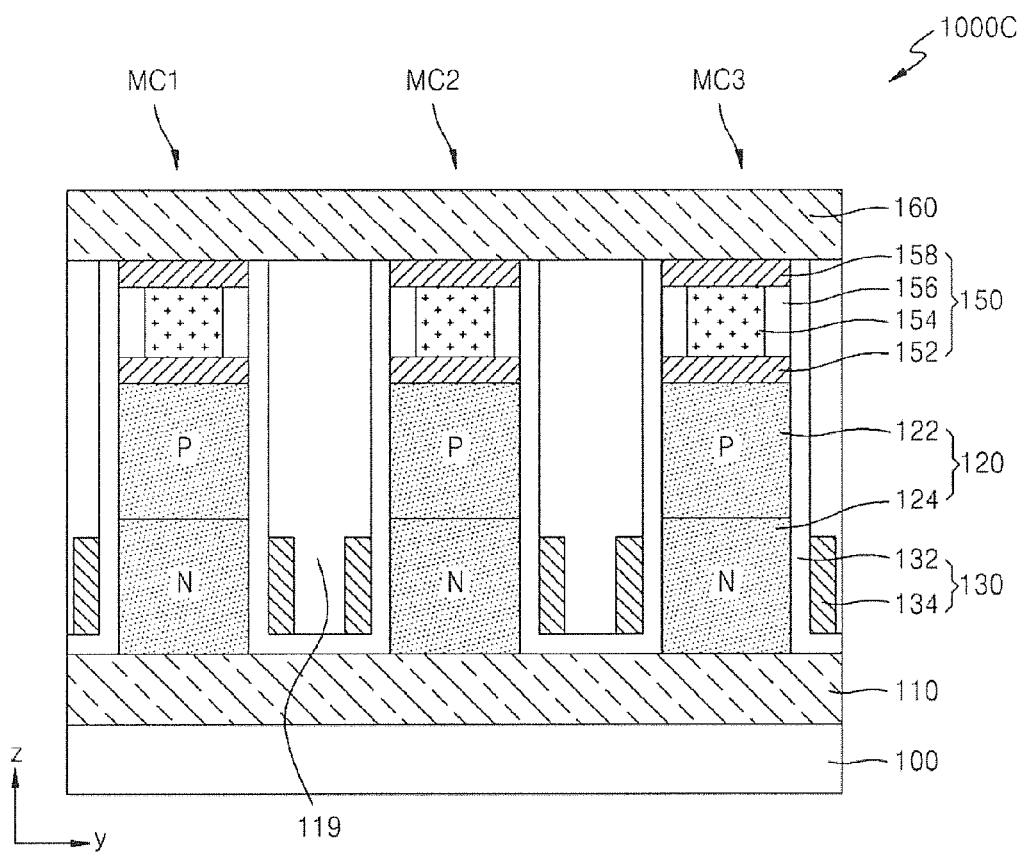

As shown in FIG. 6M, a PN diode structure is provided by the semiconductor regions 120, and the gate electrode 134, which is coupled to the PN diode structure, is coupled to the second conductive region 122. When the gate insulating film 132 is formed (as shown in FIG. 6H), the gate electrode 132 and the first wiring layer 110, or the substrate 100, may be electrically insulated from each other by remaining a part of the gate insulating film 132 on the first wiring layer 110 or the substrate 100. A subsequent process of forming the insulating layer 119 is performed in the same manner as that described with reference to FIG. 6L.

Although not shown, various modifications may be made. For example, if an order in which the selection device 125 of each memory cell and the variable resistor 150 are connected is reversed, then the variable resistor 150 may be first formed in the first opening 114 of the sacrificial layer 112 formed on the substrate 100, and then the semiconductor regions 120, which are to be the selection device 125, may be formed on the variable resistor 150. Alternatively, conductivity types of the semiconductor regions 120 of the selection device 125 may be reversed and then the semiconductor regions 120 may be manufactured.

Although the first wiring layer 110 is disclosed as a common wiring and the second wiring layer 160 is disclosed as a wiring line (as shown in FIGS. 6A through 6M), alternatively, the first wiring layer 110 may be a wiring line and the second wiring layer 160 may be a common wiring, or both the first wiring layer 110 and the second wiring layer 160 may be common wirings, as will be explained below.

Figure 7:
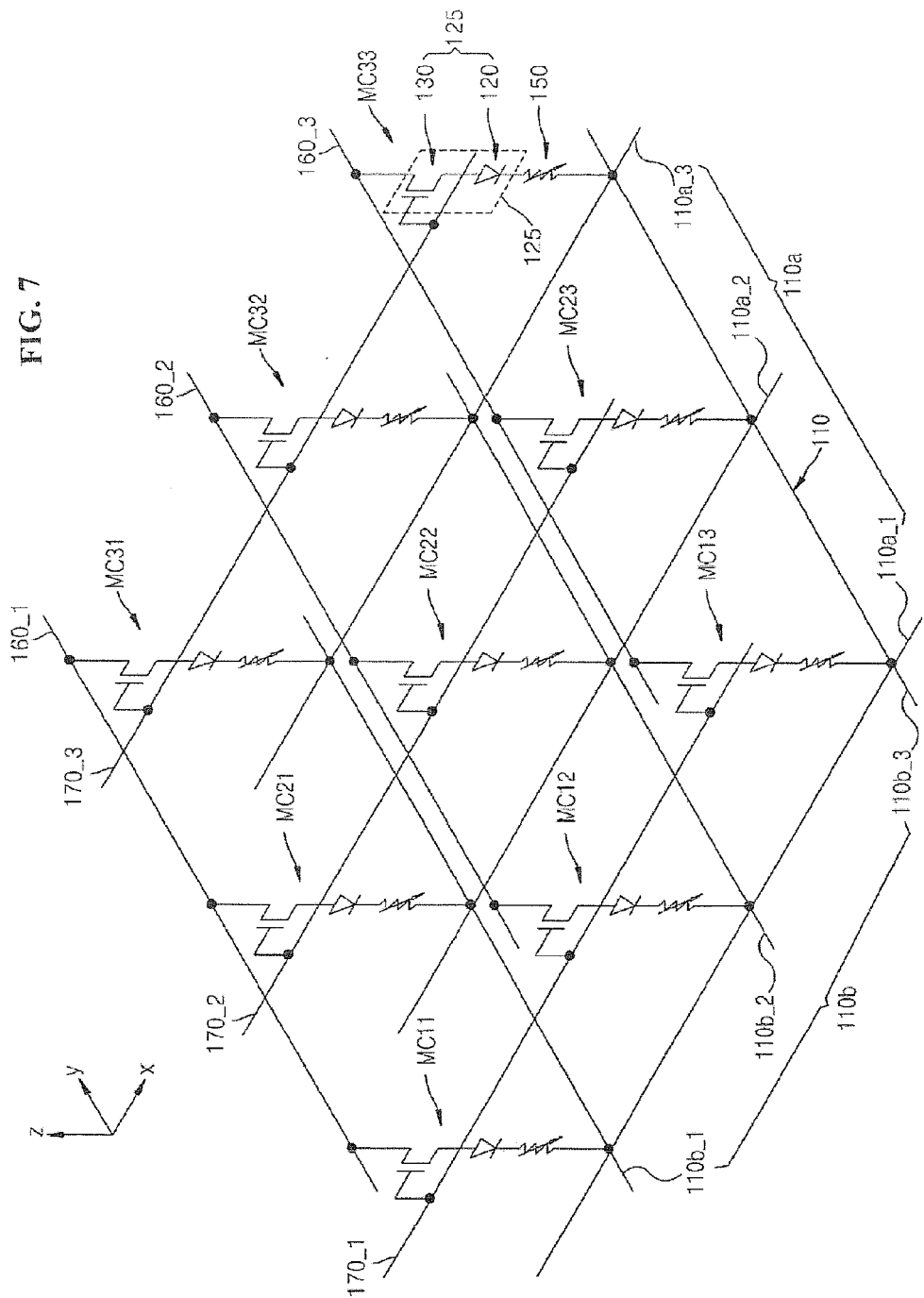
FIG. 7 is a circuit diagram illustrating a variable resistive memory device according to an exemplary embodiment of the present invention.
Figure 8A:
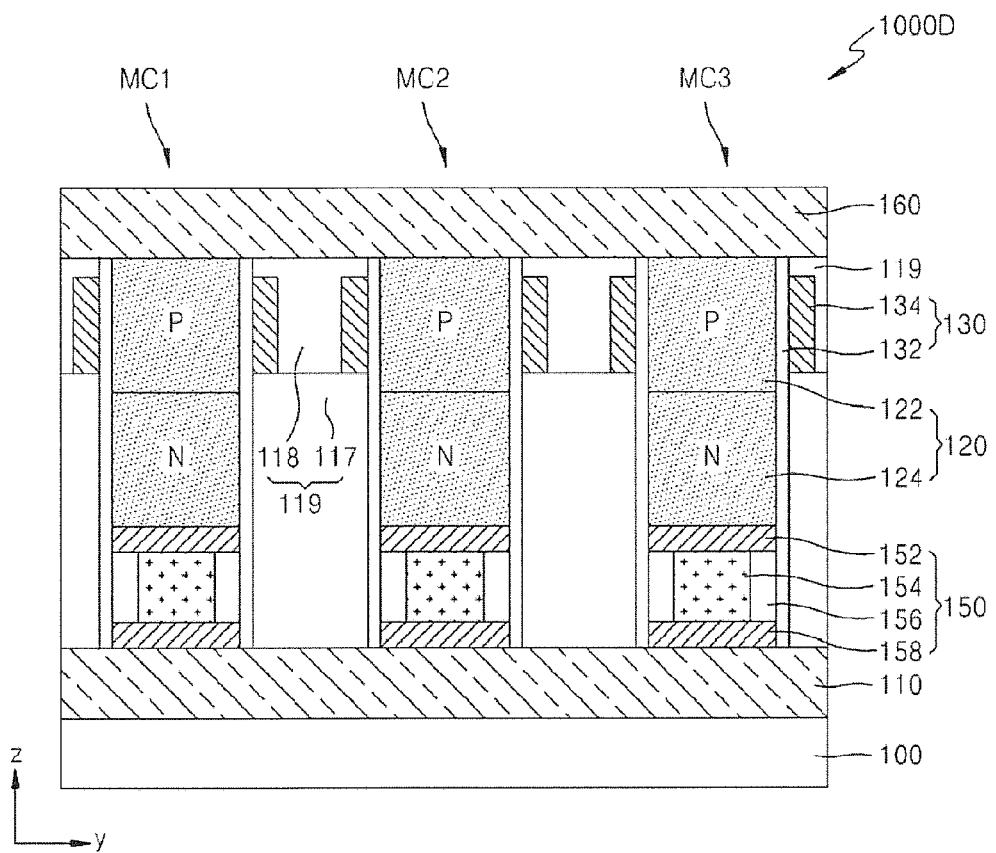
FIGS. 8A and 8B are cross-sectional views illustrating variable resistive memory devices each having the circuit diagram of FIG. 7.
Figure 8B:
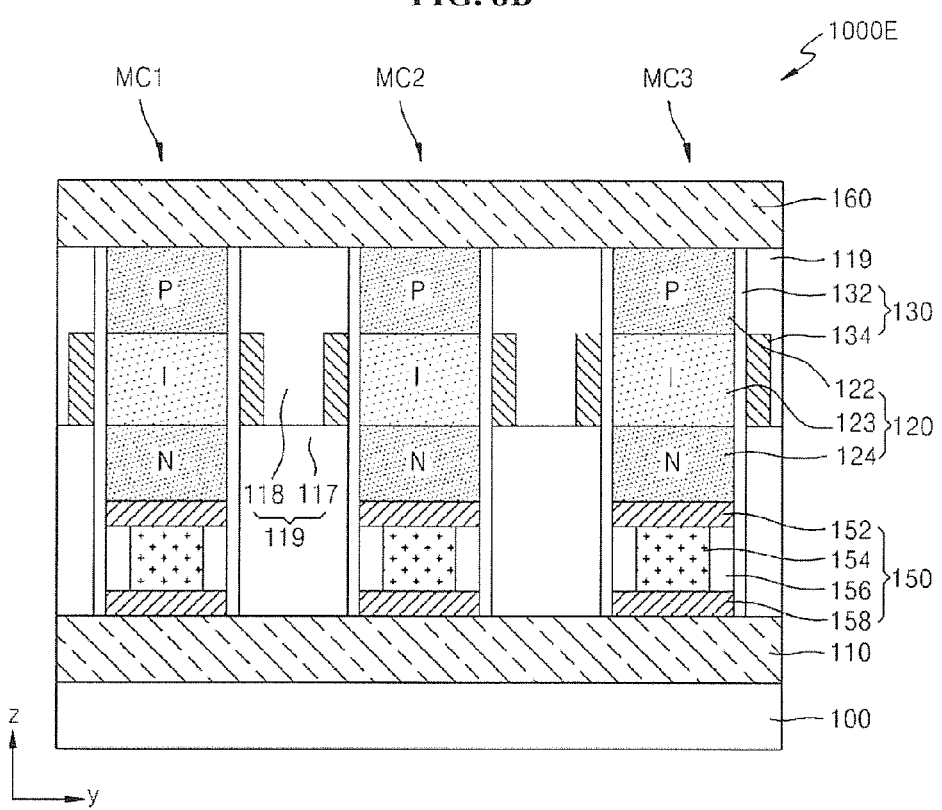

FIG. 7 is a circuit diagram illustrating a variable resistive memory device according to an exemplary embodiment of the present invention. FIGS. 8A and 8B are cross-sectional views illustrating variable resistive memory devices 1000C and 1000D each having the circuit diagram of FIG. 7.

Referring to FIG. 7, the variable resistive memory device is similar to the variable resistive memory device of FIG. 1. However, as shown in FIG. 7, an order in which the variable resistor 150 and the selection device 125, which are serially connected between a first common wiring 110a and the second wiring lines 160_1, 160_2, and 160_3, are electrically connected is reversed.

Since the order in which the selection device 125 and the variable resistor 150 are connected is reversed, each of the variable resistive memory devices 1000C and 1000D may be configured such that a height from the substrate 100 of the gate structure 130 of the selection device 125 coupled to the selection lines 170_1, 170_2, and 170_3 in the memory cells MC1, MC2, and MC3 each having a pillar structure is different from a height of the gate structure 130 of FIGS. 2B and 3B. Thus, during a fabricating process, a height of the step insulating film 117 may be greater than a height of the step insulating film 117 of FIG. 6I. For a process of fabricating each of the variable resistive memory devices 1000C and 1000D, the previous explanation made with reference to FIGS. 6A through 6M may be referred to. Alternatively, although not shown in FIGS. 7 through 8B, the gate electrode 134 may be coupled to the second conductive region 124, which is an N-type impurity region. In this case, a polarity of a voltage applied to the gate electrode 134 for driving may be reversed.

FIG. 9 is a circuit diagram illustrating a variable resistive memory device according to an exemplary embodiment.

Figure 10A:
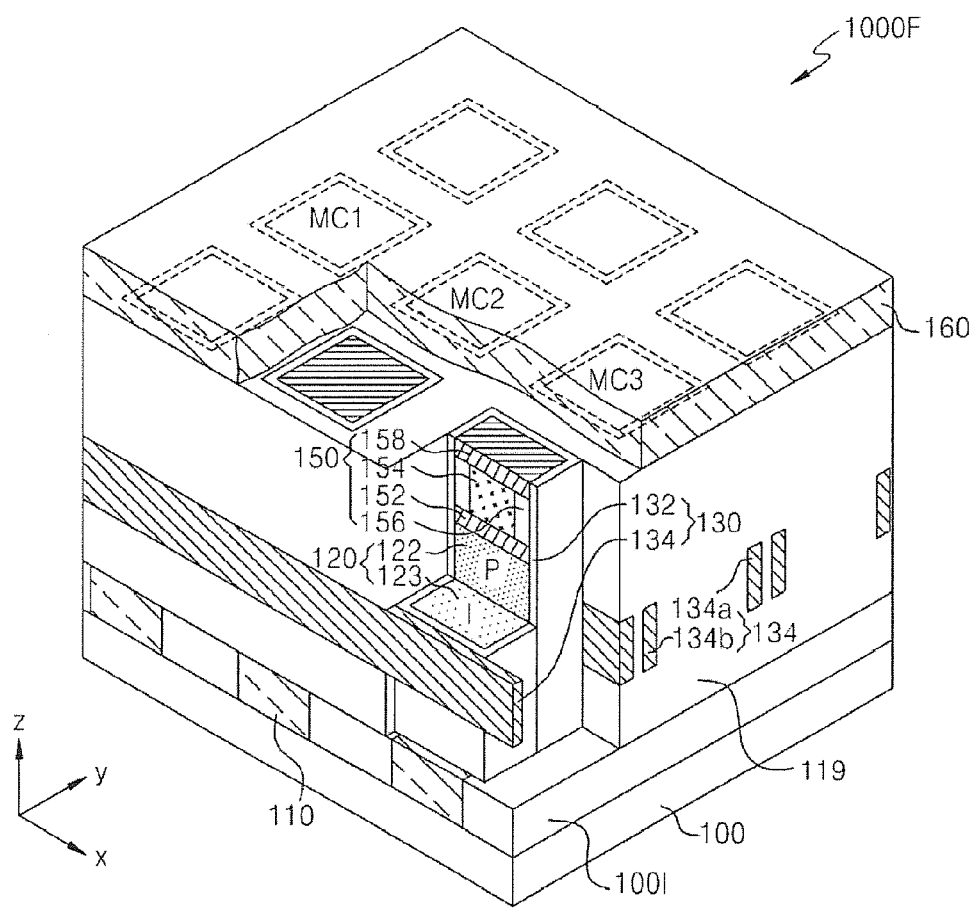
FIGS. 10A and 10B are respectively a partially cut-away perspective view illustrating a variable resistive memory device having the circuit diagram of FIG. 9 and a circuit diagram for explaining a method of driving the variable resistive memory device of FIG. 10A.
Figure 10B:
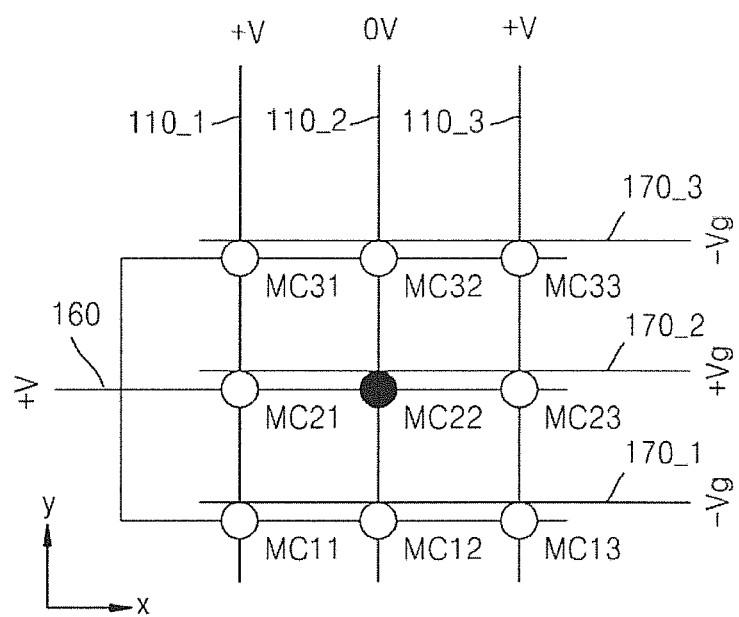

FIGS. 10A and 10B are respectively a partially cut-away perspective view illustrating a variable resistive memory device 1000E having the circuit diagram of FIG. 9 and a circuit diagram for explaining a method of driving the variable resistive memory device 1000E.

Referring to FIG. 9, the variable resistive memory device includes the variable resistor 150 and the selection device 125, serially connected between first wiring lines 110_1, 110_2, and 110_3 and a second common wiring 160. When compared with the variable resistive memory device of FIG. 1, the variable resistive memory device of FIG. 9 is characterized in that the first common wiring 110, which is designated as a word line in FIG. 1, functions as a bit line, and the second wiring lines 160, designated as bit lines in FIG. 1, function as a common word line.

The second common wiring 160 may include first sub-lines 160_a2, and 160_a3 and second sub-lines 160_b1, 160_b2, and 160_b3, which extend in the y-direction, and are to be electrically connected to the first sub-lines 160_a1, 160_a2 and 160_a3, while crossing the first sub-lines 160_a1, 160_a2, and 160_a3. Thus, the first and second sub-lines 160_a1, 160_a2, and 160_a3 and 160_b1, 160_b2, and 160_b3 may have a lattice structure on the same plane. The lattice structure is exemplary, and the second common wiring 160 may have another conductive structure in which the second common wiring 160 has any one linear structure from among the first sub-lines 160_a1, 160_a2, and 160_a3 and the second sub-lines 160_b1, 160_b2, and 160_b3 and the first and second sub-lines 160_a1, 160_a2, and 160_a3 and 160_b1, 160_b2, and 160_b3 are connected to each other to have the same potential. Alternatively, the second common wiring 160 may have a honeycomb structure or a continuous conductive planar structure instead of a linear structure or a lattice structure. As described above with reference to FIG. 1, the second common wiring 160 may reduce or suppress a performance variation such as a word line bounce which may occur according to positions of the plurality of memory cells MC11 through MC33 by reducing voltage drop and signal delay due to a wiring resistance, thereby improving reliability of the variable resistive memory device.

Referring to FIG. 10A, the variable resistive memory device 1000E includes the first wiring layer 110, that is, the first wiring lines 110_1, 110_2, and 110_3 and the second wiring layer 160, that is, the first and second sub-lines 160a_1, 160a_2, and 160a_3; and 160b_1, 160b_2, and 160b_3 disposed on the substrate 100. Although the second wiring layer 160 is disclosed as having a conductive plate, alternatively, the second wiring layer 160 may have a lattice pattern structure of the wiring layer 110 of FIG. 3A.

Referring to FIG. 10B, the specific memory cell MC22 is selected from among the memory cells MC11 through MC33. 0 V (=Vcom), which may be an operating voltage, is applied by the first wiring line 110_2 to ends of the memory cells MC12, MC22, and MC 32, which are adjacent in one direction (e.g., the y-direction). +V, which is a non-selection voltage, is applied to the first wiring lines 110_1 and 110_3 to ends of the non-selected cells MC11, M21, M31, M13, M23, and M33. +V, which is a reference voltage, may be applied by the second common wiring 160 to other ends of the plurality of memory cells MC11 through MC33. Accordingly, a voltage applied to the memory cells MC12, MC22, and MC32 may be +V. In this case, +V, which is a difference between an operating voltage and a reference voltage, may be a voltage less than Vt0, which is a reference threshold voltage, as described above with reference to FIG. 4C. Accordingly, selection devices of the memory cells MC12, MC22, and MC32 are not turned on yet.

When a negative voltage −Vg is applied as a gate voltage to the selection lines 170_1 and 170_3, which are coupled to the insulated gate structures 134 of the selection devices of the non-selected cells MC12 and MC32, and a positive voltage +V, which is an appropriate gate voltage for reducing a threshold voltage to a level equal to or less than the reference threshold voltage by swinging a threshold voltage of semiconductor regions 120 of a corresponding selection device, is applied to the selection line 170_2 coupled to the insulated gate structure 134 of the selection device of the selected cell MC22, as described with reference to FIG. 4C, only a threshold voltage of the selection device of the memory cell MC22 to be selected may be reduced to be lower than Vt1, and thus the selection device of the memory cell MC22 may be turned on and programming or readout of the variable resistor 150 of the memory cell MC22 may be performed according to the applied voltage. A gate voltage of 0 V or −V (as shown in FIG. 10B) may be applied to the selection lines 170_1 and 170_3 respectively coupled to the non-selected memory cells MC12 and MC32, and thus, a threshold voltage of the non-selected memory cells MC12 and MC32 may be increased to be higher than the reference threshold voltage, thereby suppressing a leakage current flowing through the corresponding memory cell.

Figure 11:
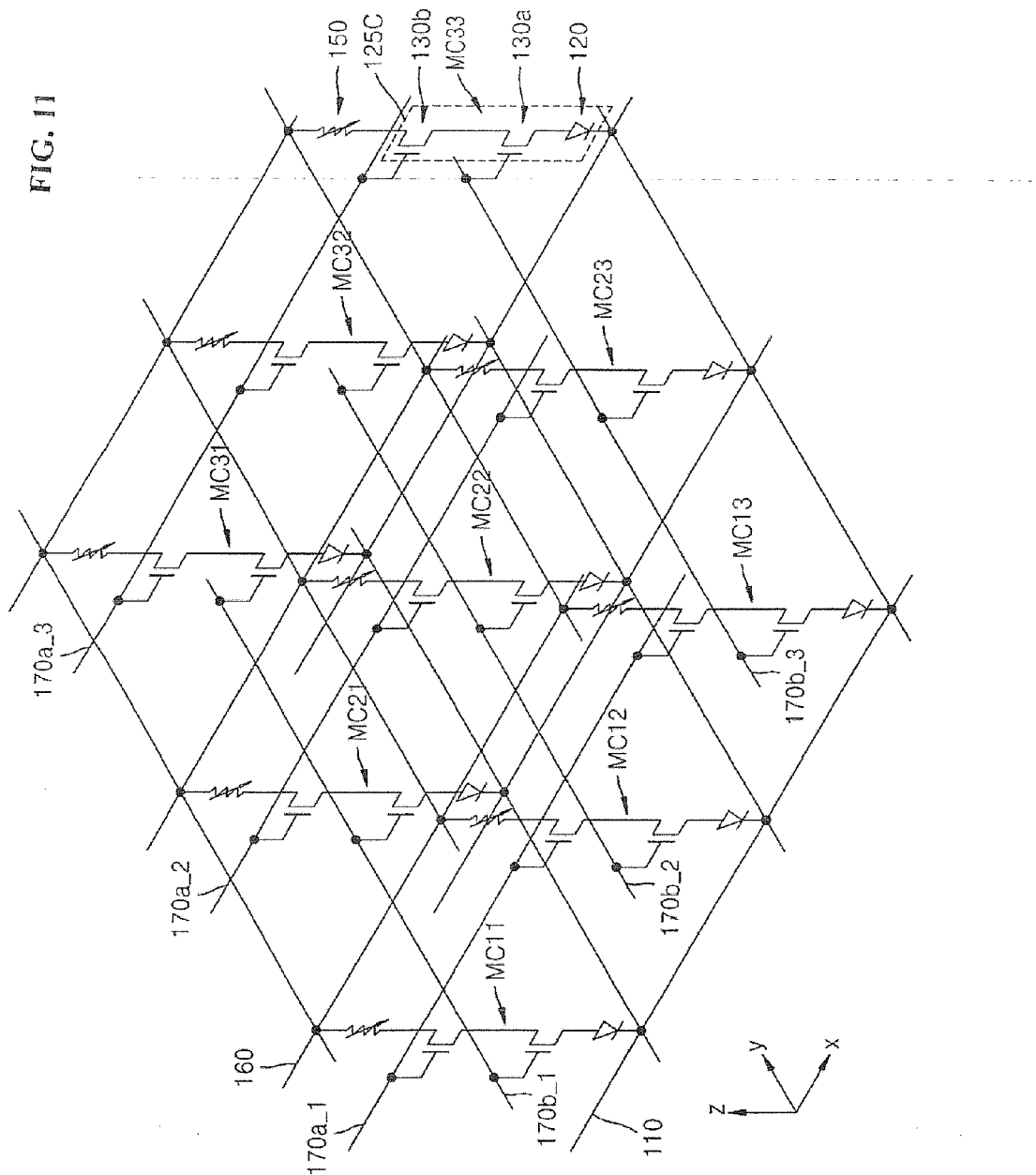
FIG. 11 is a circuit diagram illustrating a variable resistive memory device according to an exemplary embodiment.
Figure 12:
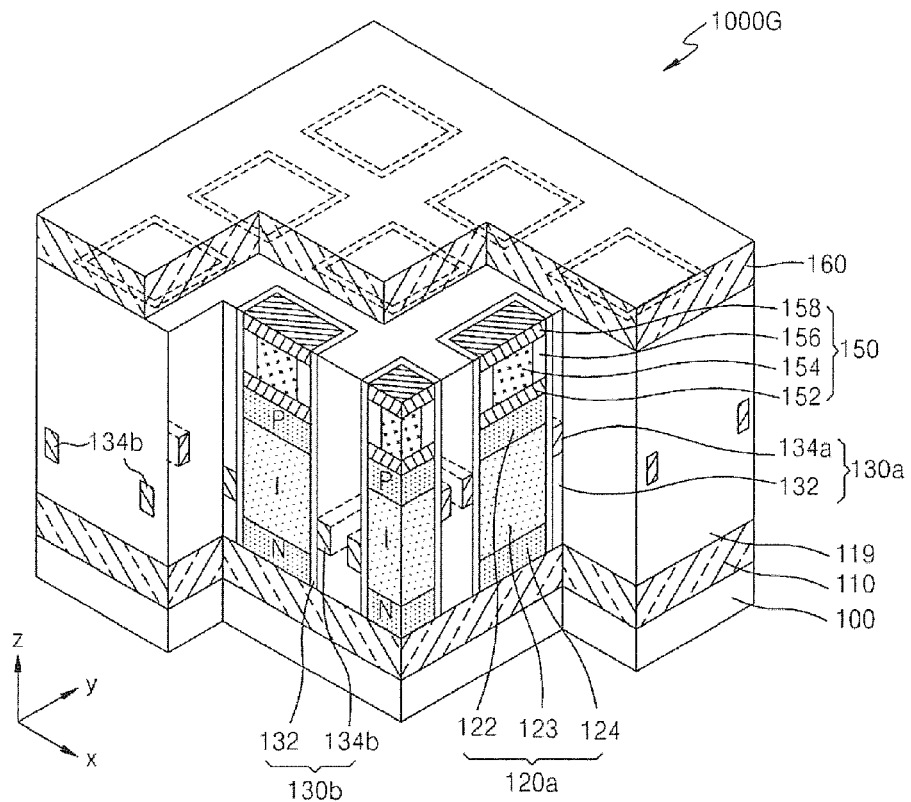
FIG. 12 is a partially cut-away perspective view illustrating a variable resistive memory device having the circuit diagram of FIG. 11.
Figure 13A:
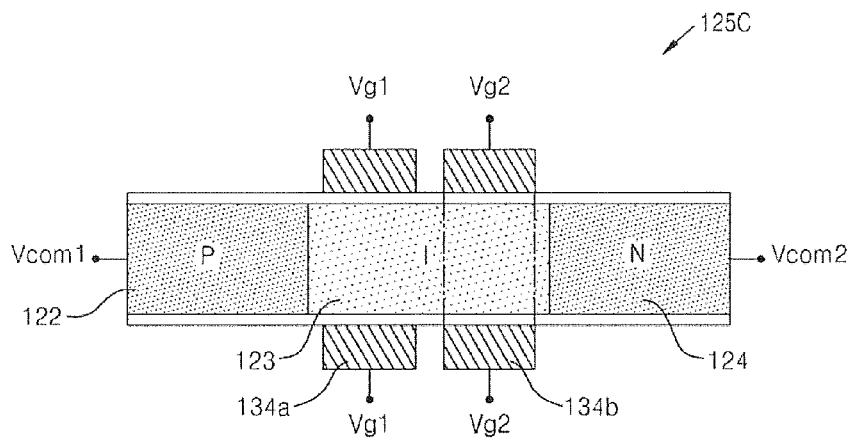
FIG. 13A is a cross-sectional view illustrating a selection device according to an exemplary embodiment.
Figure 13B:
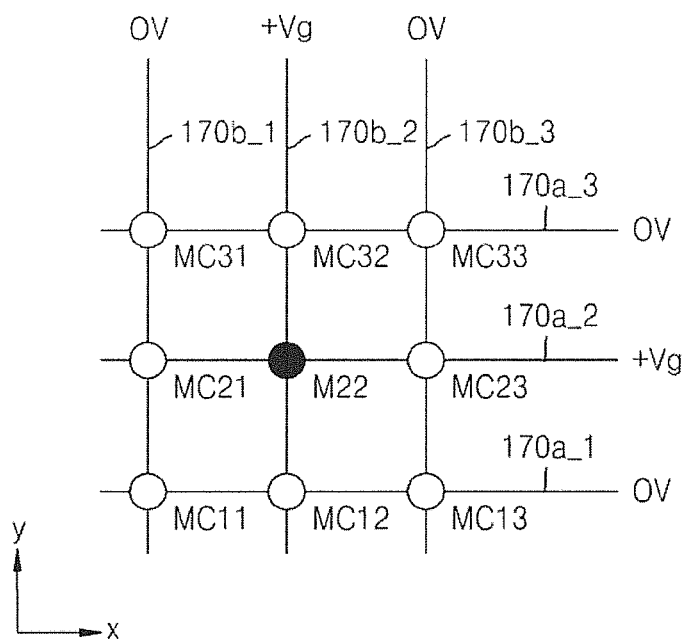
FIG. 13B is a circuit diagram for explaining a method of driving the variable resistive memory device of FIG. 11 using the selection device of FIG. 13A.

FIG. 11 is a circuit diagram illustrating an exemplary variable resistive memory device FIG. 12 is a partially cut-away perspective view illustrating a variable resistive memory device 1000G having the circuit diagram of FIG. 11. FIG. 13A is a cross-sectional view illustrating a selection device 125C. FIG. 13B is a circuit diagram for explaining a method of driving the variable resistive memory device of FIG. 11 using the selection device 125C.

Referring to FIGS. 11 and 12, the exemplary variable resistive memory device 1000G may include the first wiring layer 110, the second wiring layer 160, and the selection device 125 and the variable resistor 150 serially connected between the first and second wiring layers 110 and 160. The first wiring layer 110 and the second wiring layer 160 are common wirings having an equal potential and each may have a conductive lattice pattern including sub-lines, or may be a conductive plane as shown in FIG. 12.

The plurality of memory cells MC11 through MC33 are arranged between the first wiring layer 110 and the second wiring layer 160. Each of the plurality of memory cells MC1 through MC3 may include the selection device 125C and the variable resistor 150 serially connected to the selection device 125C. An order in which the selection device 125C and the variable resistor 150 are connected may be reversed from that in FIG. 12.

Each of the plurality of memory cells MC1 through MC3 may have a pillar structure formed perpendicular to a surface of the substrate 100. The selection device 125C may be coupled to first and second selection lines 170a_1, 170a_2, and 170a_3 and 170b_1, 170b_2, and 170b_3. The first and second selection lines 170a_1, 170a_2, and 170a_3 and 170b_1, 170b_2 and 170b_3 may extend in the x-direction and the y-direction.

Referring to FIG. 13A, the selection device 125C may include a PIN diode structure provided by the first and second conductive regions 122 and 124 having different conductivity types. The intermediate region 123 and the first and second insulated gate structures 130a and 130b that are coupled to the PIN diode structure may be independently driven. Gate electrodes 134a and 134b may be spaced apart from each other to be electrically insulated from each other, and may be respectively coupled to the first selection lines 170a_1, 170a_2, and 170a_3 and the second selection lines 170b_1, 170b_2, and 170b_3.

Although the gate electrodes 134a and 134b are disclosed as crossing each other at 90° and passing through only one surface of the intermediate region 123 from among the semiconductor regions 120, alternatively, as described above with reference to FIG. 3C, at least one of the gate electrodes 134a and 134b may extend in the x-direction or the y-direction while filling a space between adjacent memory cells and may surround a part of the intermediate region 123.

Referring to FIG. 13B, the specific memory cell MC22 is selected from among the memory cells MC11 through MC33. The first wiring layer 110 and the second wiring layer 160 may be common wirings, and any one of the first wiring layer 110 or the second wiring layer 160 may apply a reference voltage to ends of all memory cells and the other one of the first wiring layer or the second wiring layer may apply an operating voltage for programming or readout. However, since a difference between the operating voltage and the reference voltage is less than a reference threshold voltage of selection devices of the memory cells, the selection devices of the memory cells are not turned on due to the voltage applied by the first and second wiring layers 110 and 160.

In order to select the memory cell MC22, +Vg1, which may reduce a threshold voltage of the semiconductor regions 120 of a corresponding selection device to a level less than a reference threshold voltage, is applied through the first selection line 170a_2 to the first gate electrodes 134a of the selection devices of the memory cells MC21, MC22, and MC23, which are adjacent in the x-direction. 0 V is applied through the other first selection lines 170a_1 and 170a_3 to the gate electrodes 134a of the selection devices of the non-selected memory cells MC11, MC12, and MC13; and MC31 MC32, and MC33. Alternatively, a negative voltage may be applied.

+Vg2, which may reduce a threshold voltage of the semiconductor regions 120 of a corresponding selection device to a level less than a reference threshold voltage, may be applied through the second selection line 170b_2 to the second gate electrodes 134b of the selection devices of the memory cells MC12, MC22, and MC32 which are adjacent in the y-direction. 0 V or a negative voltage may be applied through the other second selection lines 170b_1 and 170b_3 to the gate electrodes 134b of the selection devices of the non-selected cells MC11, MC21, and MC31, and MC13, MC23, and MC33.

In an exemplary embodiment, a threshold voltage of a PIN diode structure is reduced to a level equal to or less than a voltage applied to both ends of the semiconductor regions 120 by changing an energy band of the intermediate region 123 due to voltages +Vg1 and Vg2 applied to the first gate electrode 134a and the second gate electrode 134b, which are independently controlled, thereby turning on the PIN diode structure. Accordingly, programming or readout may be performed on a selected memory cell. Since a common operating voltage is applied to all memory cells, performance degradation such as voltage drop and signal delay due to a conventional word line resistance may be reduced or removed.

Figure 14:
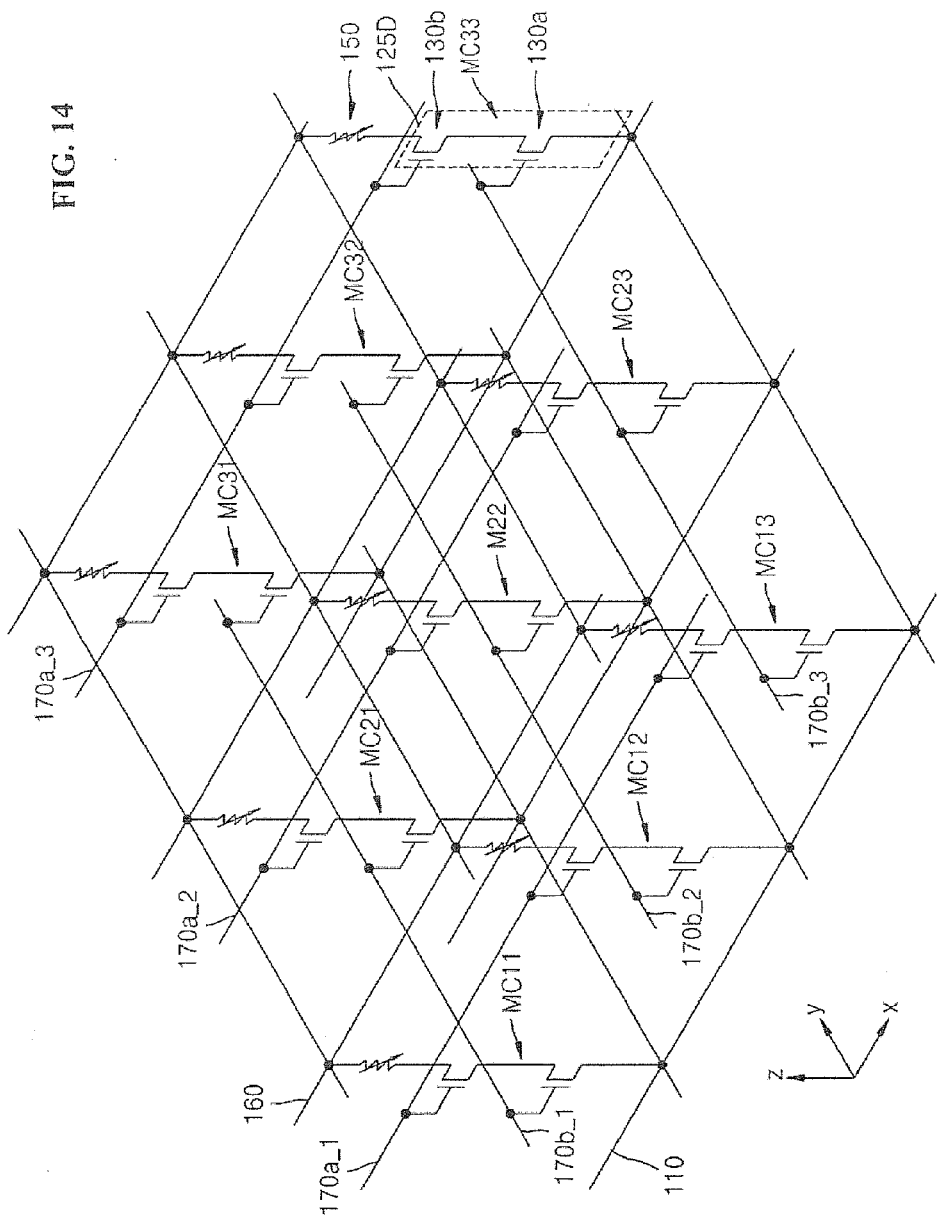
FIG. 14 is a circuit diagram illustrating a variable resistive memory device according to an exemplary embodiment.
Figure 15A:
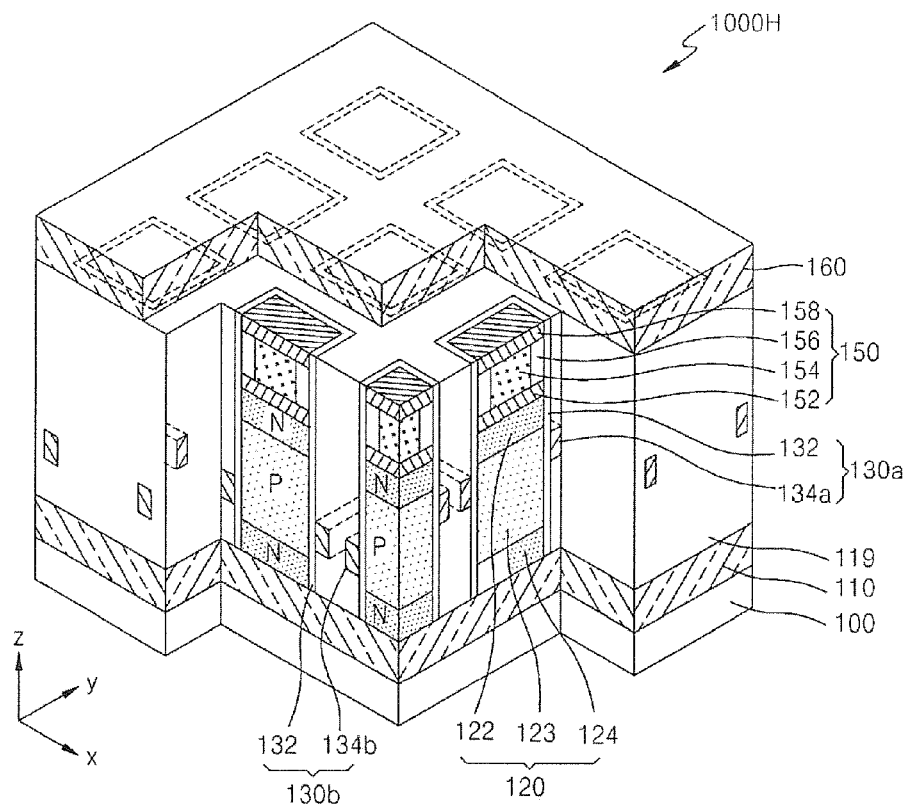
FIG. 15A is a partially cut-away perspective view illustrating a variable resistive memory device having the circuit diagram of FIG. 14.
Figure 15B:
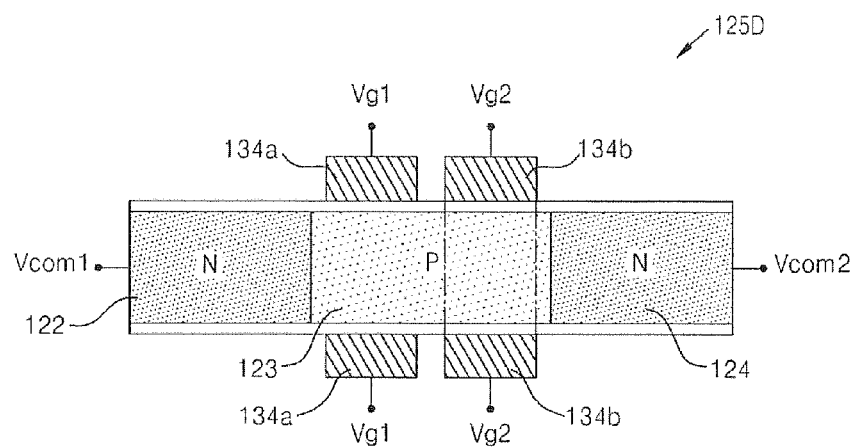
FIG. 15B is a cross-sectional view illustrating a selection device according to an exemplary embodiment.

FIG. 14 is a circuit diagram illustrating an exemplary variable resistive memory device. FIG. 15A is a partially cut-away perspective view illustrating a variable resistive memory device 1000H having the circuit diagram of FIG. 14. FIG. 15B is a cross-sectional view illustrating a selection device 125D.

Referring to FIGS. 14 and 15A, the variable resistive memory device 1000H may include the first wiring layer 110, the second wiring layer 160, and the selection device 125D and the variable resistor 150 serially connected between the first and second wiring layers 110 and 160. The variable resistive memory device 1000H is similar to the variable resistive memory device 1000G in that the first wiring layer 110 and the second wiring layer 160 may be common wirings that may provide an equipotential. As described above, the first wiring layer 110 and the second wiring layer 160 may have a conductive lattice pattern including sub-lines, or may be a conductive plane as shown in FIG. 15A.

The plurality of memory cells MC11 through MC33 are arranged between the first wiring layer 110 and the second wiring layer 160. Each of the plurality of memory cells MC1 through MC3 may include the selection device 125D and the variable resistor 150 serially connected to the selection device 125D. An order in which the selection device 125D and the variable resistor 150 are connected may be reversed from that in FIG. 15A.

Each of the plurality of memory cells MC1 through MC3 may have a pillar structure formed perpendicular to a surface of the substrate 100. The selection device 125D may be coupled to the first and second selection lines 170a_1, 170a_2, and 170a_3 and 170b_1, 170b_2, and 170b_3. The first and second selection lines 170a_1, 170a_2, and 170a_3 and 170b_1, 170b_2, and 170b_3 may extend in the x-direction and the y-direction.

Referring to FIG. 15B, in order to provide a metal-oxide-semiconductor field-effect-transistor (MOSFET) channel structure using the semiconductor regions 120, the selection device 125D may include the first conductive region 122, the second conductive region 124 having the same conductivity type as that of the first conductive impurity region, and the intermediate region 123. The first conductive region 122 may be an N-type or P-type region, and the intermediate region 123 may have a conductivity type opposite to that of the first conductive region 122. Although the selection device 125D of FIG. 15B includes an N-channel MOSFET structure, a P-channel MOSFET structure may be used.

The selection device 125D may include first and second insulated gate structures 130a and 130b that are coupled to the MOSFET channel structure and may be independently driven. The first and second insulated gate structures 130a and 130b may be coupled to the intermediate region 123 which is a channel forming region. The gate electrodes 134a and 134b may be spaced apart from each other to be electrically separated from each other, and may be respectively coupled to the first selection lines 170a_1, 170a_2, and 170a_3 and the second selection lines 170b_1, 170b_2, and 170b_3.

Although the gate electrodes 134a and 134b are disclosed as crossing each other at 90° and passing through only one surface of the intermediate region 123 in FIGS. 15A and 15B, alternatively, at least one of the gate electrodes 134a and 134b may extend while filling a space between memory cells which are adjacent in the x-direction or the y-direction and may surround a part of the intermediate region 123.

A method of selecting the specific memory cell MC22 from among the memory cells MC11 through MC33 is similar to that described with reference to FIG. 13B. For example, a reference voltage and an operating voltage are respectively applied to the first wiring layer 110 and the second wiring layer 160, and a difference between the operating voltage and the reference voltage is less than a reference threshold voltage. In this case, the memory cell MC22 may be selected by applying +Vg1 and +Vg2 which may reduce a threshold voltage of the selection device 125D to a level less than a reference threshold voltage to the gate electrodes 134a and 134b of the memory cell MC22.

Figure 16:
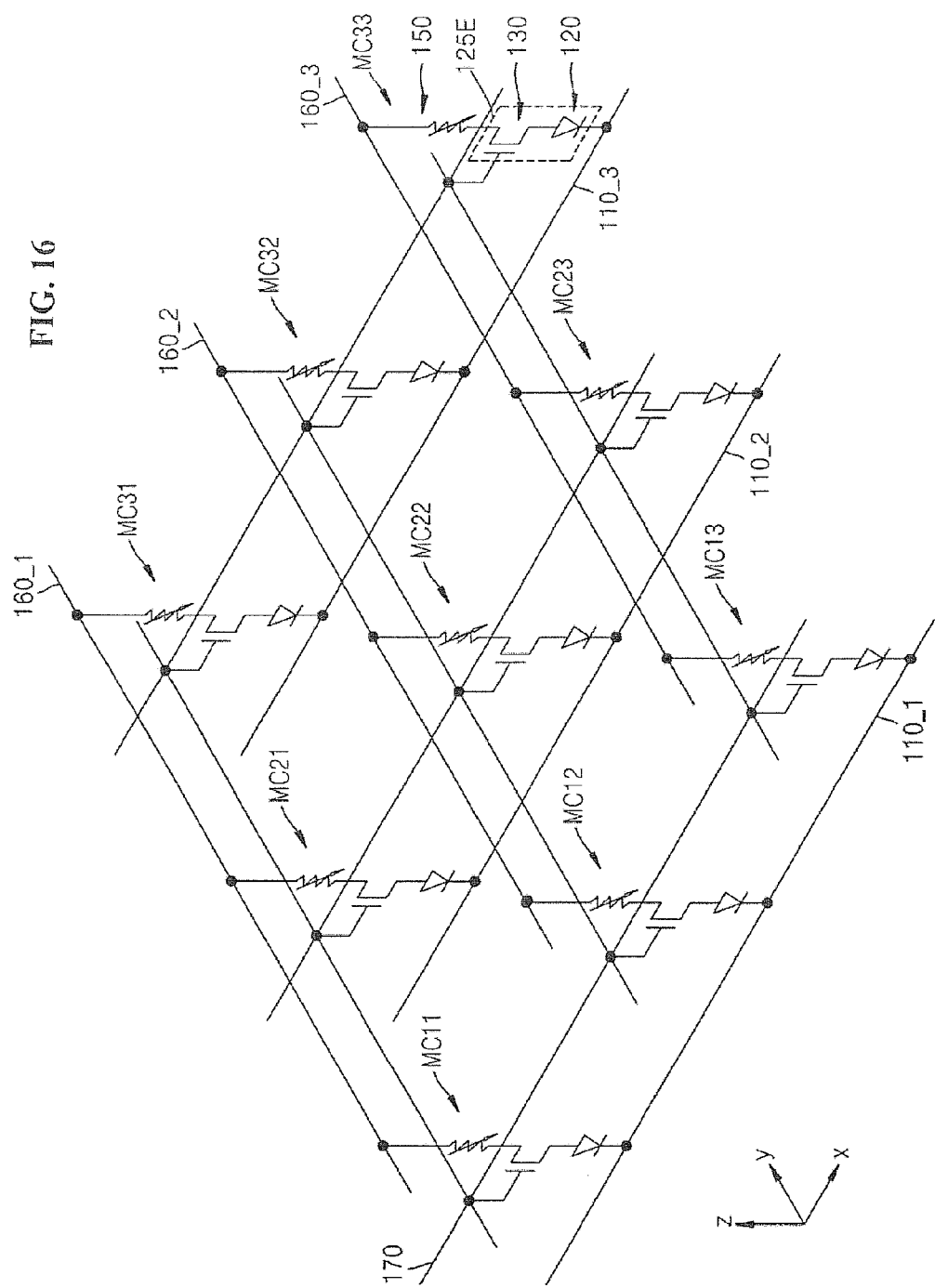
FIG. 16 is a circuit diagram illustrating a variable resistive memory device according to an exemplary embodiment.
Figure 17A:
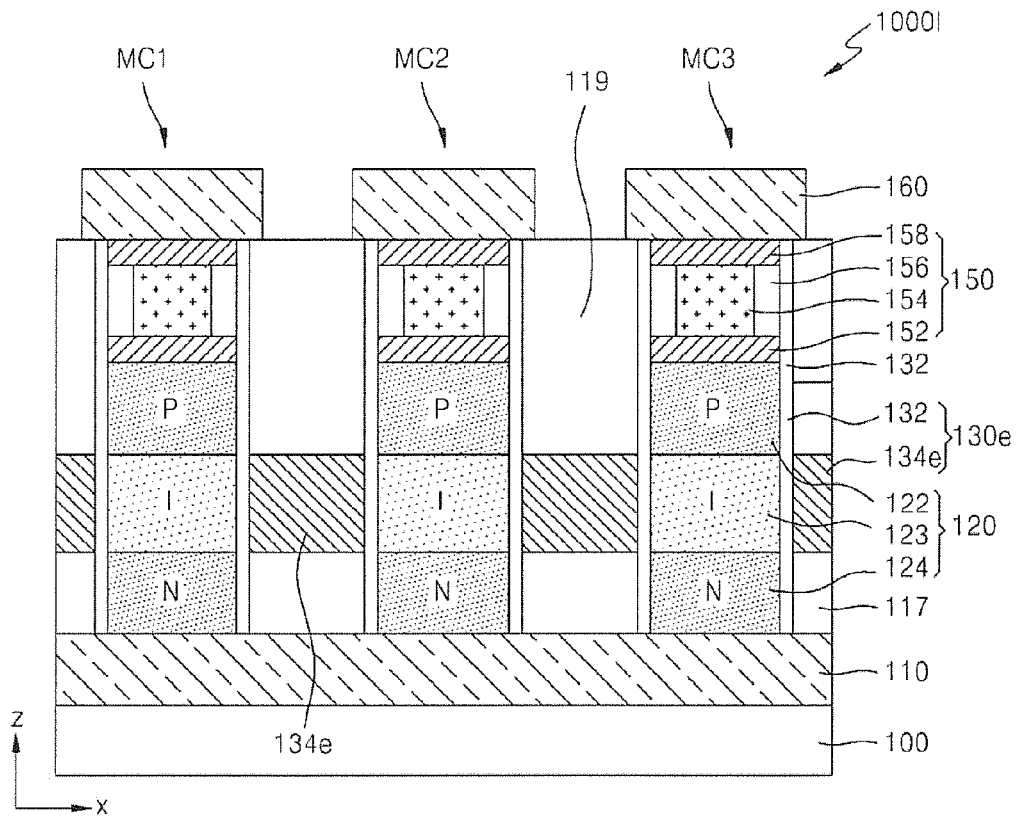
FIG. 17A is a partially cut-away perspective view illustrating a variable resistive memory device having the circuit diagram of FIG. 16.

FIG. 16 is a circuit diagram illustrating a variable resistive memory device according to an exemplary embodiment. FIG. 17A is a partially cut-away perspective view illustrating a variable resistive memory device 10001 having the circuit diagram of FIG. 16, FIG. 17B is a circuit diagram for explaining a method of driving the variable resistive memory device 10001 using a selection device 125E.

Referring to FIGS. 16 and 17A, the variable resistive memory device 10001 includes first wiring lines 110_1, 110_2, and 110_3 (collectively referred to as first wiring line 110), which extend in a first direction (e.g. the x-direction), and second wiring lines 160_1, 160_2, and 160_3 (collectively referred to as second wiring line 160), which extend in a second direction (e.g., the y-direction). The plurality of memory cells MC11 through MC33 may be provided between the first wiring lines 110_1, 110_2, and 110_3 and the second wiring lines 160_1, 160_2, and 160_3. Any one of the first wiring line 110 and the second wiring line 160 may be a bit line and the other may be a word line.

The variable resistive memory device 10001 includes a common selection line 170 that may be coupled to selection devices of the plurality of memory cells MC11 through MC33 and may apply a gate voltage of an equipotential. The gate electrode 134 of the insulated gate structure 130 coupled to the common selection line 170 may extend as a single element while passing only one surface of the intermediate region 123, or may extend while filling a space between the memory cells MC1, MC2, and MC1 Alternatively, the gate electrode 134 may have a lattice pattern or a conductive planar structure.

Figure 17B:
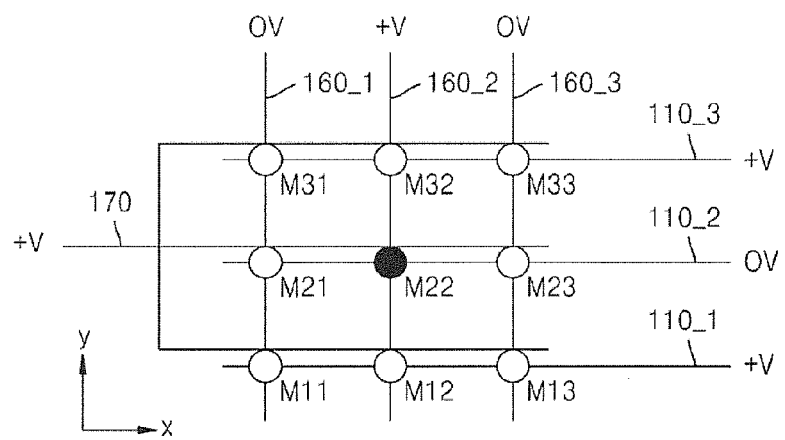
FIG. 17B is a circuit diagram for explaining a method of driving the variable resistive memory device of FIG. 17A using a selection device.

Referring to FIG. 17B, in order to select the specific memory cell MC22 from among the memory cells MC11 through MC33, the memory cell MC22 is selected by respectively applying a reference voltage and an operating voltage, which may turn on the selection device 130, to the first wiring line 110_2 and the second wiring line 160_2 of the memory cell MC22 to be selected. Also, a common voltage Vg is applied to the common selection line 170. In this case, a threshold voltage of the selection devices of the semiconductor regions 120 of all of the plurality of memory cells MC11 through MC33 may be reduced to a level less than a reference threshold voltage. The common voltage Vg may be selected not to turn on the non-selected cells.

A magnitude of a driving current flowing through the selection device of the selected memory cell MC22 when the common voltage Vg is applied may be higher than that when the common voltage Vg is not applied. As a result, when the common voltage Vg is applied, fast and reliable programming and readout may be performed. Accordingly, without making a peripheral circuit large in order to amplify a current, a driving current for driving the variable resistive memory device may be increased only by applying the common voltage Vg, thereby making it possible to minimize the variable resistive memory device and improve speed and reliability of the variable resistive memory device.

The common voltage Vg applied to the common selection line 170 may have a reversed polarity as −Vg in order to increase a threshold voltage. In this case, a difference between a reference voltage and an operating voltage applied to the selected memory cell MC22 may be great enough not to turn off the selected memory cell MC22 due to the common voltage Vg. In this case, a leakage current and a parasitic current in the non-selected memory cells may be reduced, thereby reliably driving the memory cells.

Figure 18A:
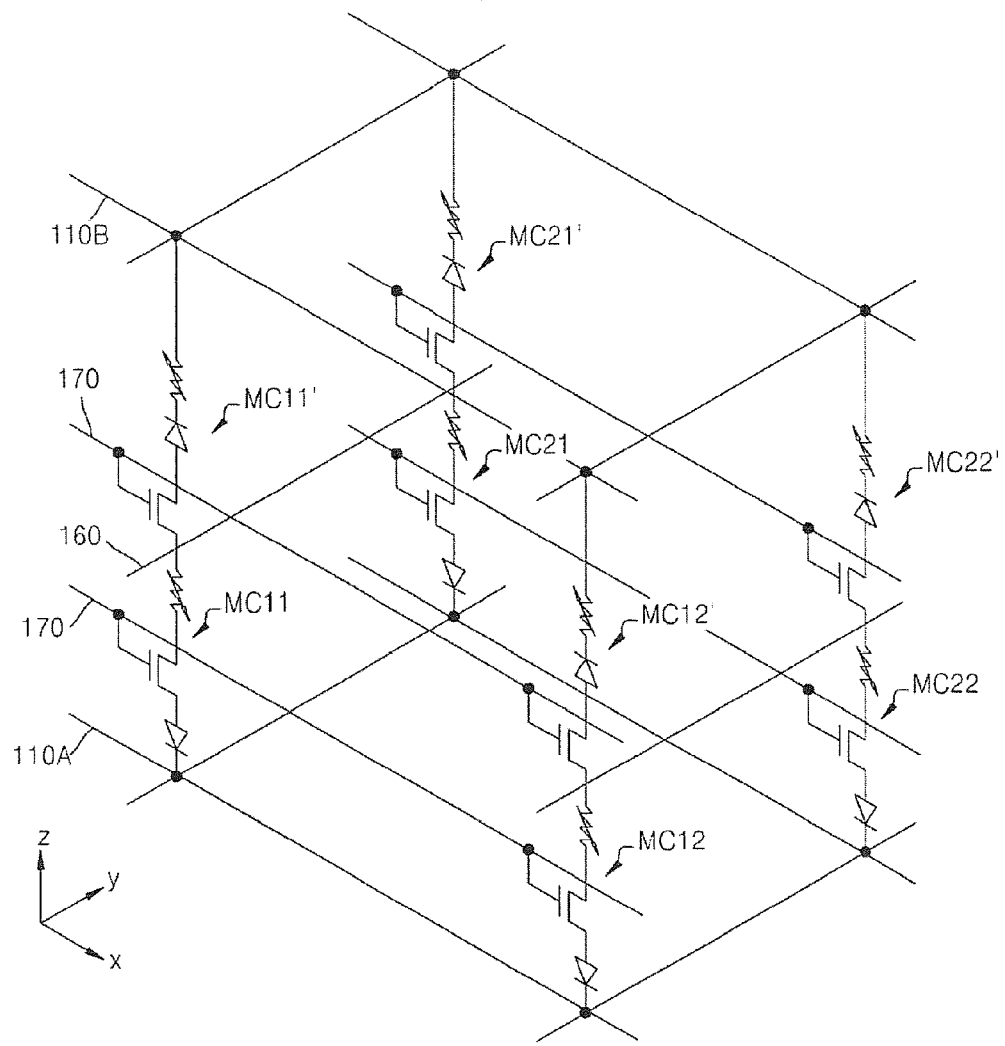
FIGS. 18A and 18B are respectively a circuit diagram and a cross-sectional view illustrating a variable resistive memory device according to an exemplary embodiment.
Figure 18B:
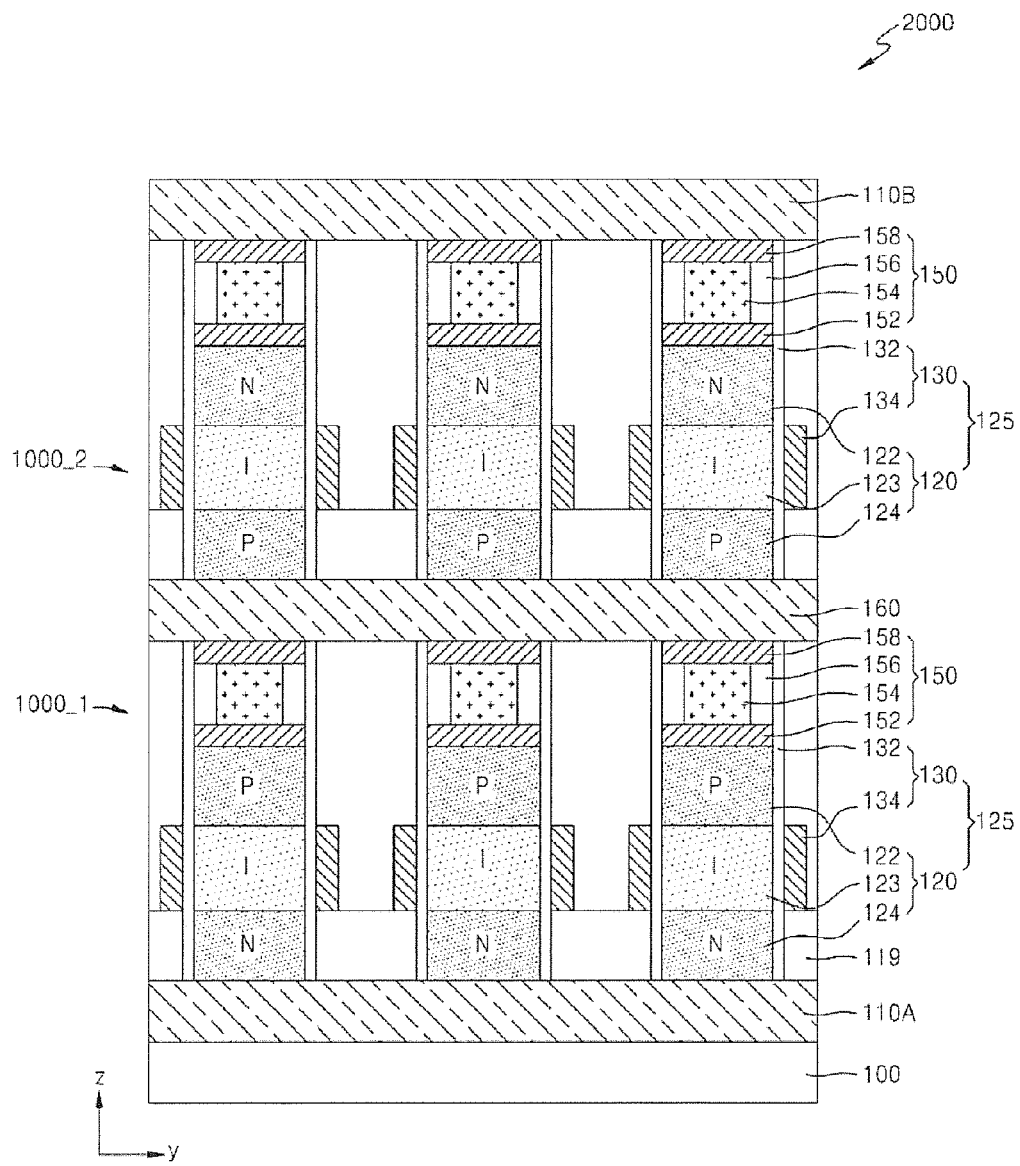

FIGS. 18A and 18B are respectively a circuit diagram and a cross-sectional view illustrating an exemplary variable resistive memory device 2000. For elements previously denoted by the same reference numerals, the previous explanation may be referred to and a repeated explanation thereof will not be given.

Referring to FIGS. 18A and 18B, the variable resistive memory device 2000 has a 3D vertical structure in which two memory stacks 1000_1 and 1000_2 are stacked perpendicular to a surface of a substrate 100. Each of the memory stacks 1000_1 and 1000_2 includes a first wiring layer 110A, the second wiring layer 160, and a third wiring layer 110b, which are respectively coupled to memory cells. The second wiring layer 160 of the variable resistive memory device 2000 may be shared by the two memory stacks 1000_1 and 1000_2 as shown in FIGS. 18A and 18B. Alternatively each of the memory stacks 1000_1 and 1000_2 may independently include second wiring layers.

The first wiring layer 110A and the third wiring layer 110B may be common wirings, and the second wiring layer 160 may be a wiring line. In this case, the first and third wiring layers 110A and 110B may be common word lines, and the second wiring layer 160 may be a bit line. Alternatively, the first wiring layer 110A and the third wiring layer 110b may be wiring lines, and the second wiring layer 160 may be a common wiring.

A process of stacking the memory stacks 1000_1 and 1000_2 may be performed by forming the first memory stack 1000_1 and then forming the second memory device 2000 according to the fabricating method described with reference to FIGS. 6A through 6M. Alternatively, the process of stacking the memory stacks 1000_1 and 1000_2 may be performed by fabricating the first memory stack 1000_1 and the second memory stack 1000_2 by using separate processes, and then attaching the first and second memory stacks 1000_1 and 1000_2 by using wafer bonding. The memory stacks 1000_1 and 1000_2 may be attached to each other by alloying wiring layers exposed to attached surfaces, or physically or chemically bonding interlayer insulating films.

Although not shown in FIGS. 18A and 18B, structures of memory cells MC11 through MC22 and MC11' through MC22' of the memory stacks 1000_1 and 1000_2 may be variously modified as will be described below. For example, a selection device may have a PN diode structure or a MOSFET channel structure instead of a PIN diode structure. An order in which the selection device and a variable resistor are connected may be reversed.

Characteristics and advantages described above with reference to the drawings are compatible and thus may be replaced or combined unless clearly contradicted, and such modifications are also within the scope of the present invention.

Also, various variable resistive memory devices described with reference to the drawings may be implemented as single memory devices or as a system-on-chip (SOC) integrated with other devices, such as a logic processor, an image sensor, or a radio frequency (RF) device, into a single chip. Also, a wafer chip on which a variable resistive memory device is formed may be attached to another wafer chip on which a different type of device is formed by using an adhesive, soldering, or wafer bonding, and a resultant structure may be individualized as a single chip.

Also, exemplary variable resistive memory devices may be realized as any of various semiconductor packages. For example, the variable resistive memory devices may be packaged by package-on-package (PoP), ball grid arrays (BGAs), chip scale packages (CSPs), plastic leaded chip carrier (PICC), plastic dual in-line package (PDIP), die in waffle pack, die in wafer form, chip on board (COB), ceramic dual in-line package (CERDIP), plastic metric quad flat pack (MQFP), thin quad flatpack (TQFP), small Outline (SOIC), shrink small outline package (SSCP), thin small outline (TSOP), thin quad flatpack (TQFP), system in package (SIP), multi chip package (MCP), wafer-level fabricated package (WFP), or wafer-level processed stack package (WSP). A package on which the exemplary variable resistive memory devices are mounted may further include a controller or a logic device for controlling the package.

Figure 19:
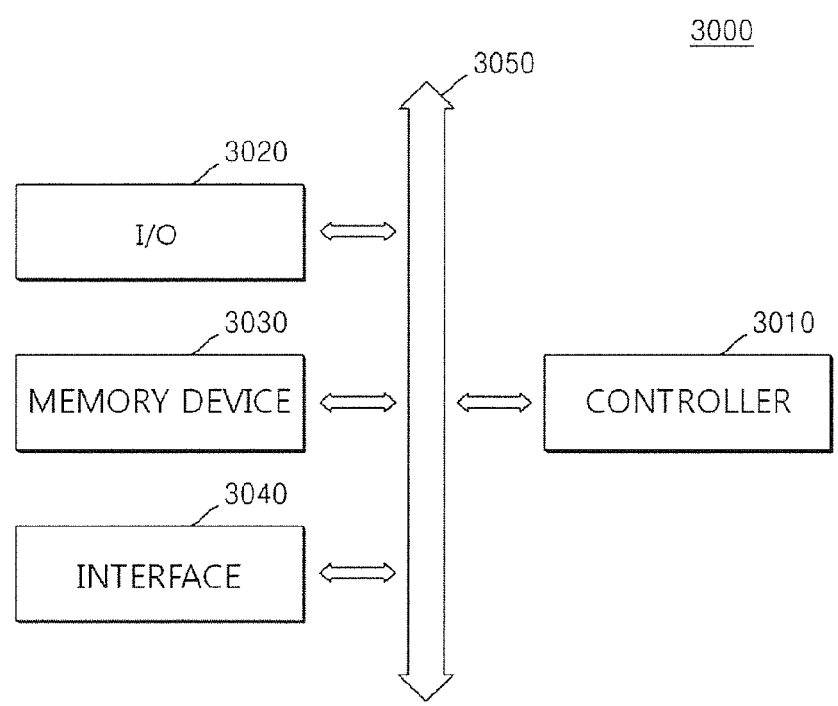
FIG. 19 is a block diagram illustrating an exemplary electronic system including variable resistive memories.

FIG. 19 is a block diagram illustrating an exemplary electronic system 3000 including variable resistive memory devices.

Referring to FIG. 19, the electronic system 3000 may include a controller 3010, an input/output (I/O) device 3020, a storage device 3030, an interface 3040, and a bus 3050. The controller 3010, the I/O device 3020, the storage device 3030, and/or the interface 3040 may be coupled to one another via the bus 3050.

The controller 3010 may include at least one of a microprocessor, a digital signal processor, a micro controller, and any of logic devices that may perform a similar function to that thereof. The I/O device 1020 may include a keypad, a keyboard, or a display device. The storage device 3030 may store data and/or commands, and may include variable resistive memory devices disclosed herein.

The storage device 3030 may have a mixed structure further including another type of semiconductor device (for example, a dynamic random access (DRAM) device and/or an embedded static random access memory (ESRAM) device). The interface 3040 may transmit or receive data to or from a communication network. The interface 3040 may be a wired or wireless interface. To this end, the interface 3040 may include an antenna or a wired/wireless transceiver. Although not shown in FIG. 19, the electronic system 3000, which is an operation memory for improving an operation of the controller 3010, may further include a high-speed DRAM and/or ESRAM.

The electronic system 3000 may be applied to a personal digital assistant (PDA), a portable computer, a tablet PC, a wireless phone, a mobile phone, a digital music player, a memory card, or any electronic device that may wirelessly transmit or receive information.

According to an exemplary embodiment, since voltage drop and delay of a signal for driving a selection device connected to each of memory cells are reduced due to a common wiring providing an equipotential, a variable resistive memory device that may reduce or suppress a performance variation according to a position in an array of a selected memory cell may be provided. Also, since a threshold voltage of the selection device is swung, a memory cell may be selected. Also, since a magnitude of an ON-current flowing through the selection device is increased, a variable resistive memory device that may be minimized and improve reliability during an operation requiring a large current such as a programming operation may be provided.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A variable resistive memory device comprising:
   a plurality of memory cells arranged in a first direction and in a second direction different from the first direction, each of the plurality of memory cells comprising a variable resistor and a selection device serially connected to the variable resistor;

a common wiring electrically connected to first ends of the plurality of memory cells arranged in both of the first direction and second direction to apply a common reference voltage to the first ends of the plurality of memory cells;

a plurality of wiring lines, each wiring line of the plurality of wiring lines being electrically connected to second ends of the plurality of memory cells arranged in the first direction; and a plurality of selection lines, each selection line of the plurality of selection lines being coupled to the selection devices of the plurality of memory cells arranged in the second direction to select any one of the plurality of memory cells via the plurality of wiring lines.

2. The variable resistive memory device of claim 1, wherein the common wiring comprises a plurality of sub-lines electrically connected to one another.

3. The variable resistive memory device of claim 1, wherein the common wiring comprises a conductive plane.

4. The variable resistive memory device of claim 1, wherein the selection device comprises:
   semiconductor regions having different conductivity types and disposed adjacent to each other to provide a junction therebetween; and
   an insulated gate structure coupled to any one of the semiconductor regions,
   wherein the insulated gate structure comprises a gate electrode coupled to any one of the plurality of selection lines.

5. The variable resistive memory device of claim 4, wherein the insulated gate structure controls a threshold voltage for turning on the semiconductor regions by applying an electric field to a corresponding semiconductor region of the semiconductor regions, coupled to the insulated gate structure.

6. The variable resistive memory device of claim 4, wherein the gate electrode is formed on a gate insulating film, formed on a corresponding semiconductor region, so as to extend beyond or surround at least a portion of the corresponding semiconductor region of the semiconductor regions.

7. The variable resistive memory device of claim 4, wherein the variable resistor and the semiconductor regions of the selection device have a pillar structure perpendicularly formed on a substrate,
   wherein the common wiring and the plurality of wiring lines are parallel to a main surface of the substrate with the pillar structure therebetween, and
   wherein the gate electrode extends between the common wiring and the plurality of wiring lines.

8. The variable resistive memory device of claim 7, wherein the gate electrode is formed as a spacer on each side wall of the semiconductor regions.

9. The variable resistive memory device of claim 7, wherein a gate insulating film of the insulated gate electrode surrounds a side wall of the pillar structure.

10. The variable resistive memory device of claim 4, wherein the semiconductor regions comprise a PN diode structure, a PIN diode structure, or a metal-oxide-semiconductor field-effect-transistor (MOSFET) channel structure.

11. The variable resistive memory device of claim 1, wherein the variable resistor comprises a phase-change material, a switchable unipolar or bipolar conductive bridging material, a switchable polymer, a programmable metallization cell (PMC) material, an antifuse material, a fuse material, or a magnetoresistance effect material.

12. A variable resistive memory device comprising:
   a plurality of memory cells arranged in a first direction and a second direction different from the first direction, each of the plurality of memory cells comprising a variable resistor and a selection device serially connected to the variable resistor;
   a first common wiring electrically connected to first ends of the plurality of memory cells and applying a reference voltage;
   a second common wiring electrically connected to second ends of the plurality of memory cells and applying an operating voltage; and
   first and second selection lines, the first and second selection lines coupled to a selection device of the plurality of memory cells and independently driven to select one of the plurality of memory cells.

13. The variable resistive memory device of claim 12, wherein at least one of the first or the second common wirings comprises a plurality of sub-lines that are electrically connected to one another.

14. The variable resistive memory device of claim 12, wherein at least one of the first or second common wirings is a conductive plane.

15. The variable resistive memory device of claim 12, wherein the first selection lines and the second selection lines extend in the first direction and the second direction, respectively.

16. The variable resistive memory device of claim 12, wherein the selection device comprises:
   semiconductor regions having different conductivity types and disposed adjacent to each other to provide a junction therebetween; and
   first and second insulated gate structures coupled to any one semiconductor region, of the semiconductor regions, and the first and second insulated gate structures being electrically separated from each other,
   wherein the first and second insulated gate structures comprise gate electrodes respectively coupled to the first and second selection lines.

17. The variable resistive memory device of claim 16, wherein each of the first and second insulated gate structures controls a threshold voltage for turning on the semiconductor regions by applying an electric field to a corresponding semiconductor region coupled to each of the first and second insulated gate structures.

18. The variable resistive memory device of claim 12, wherein the first and second insulated gate structures comprise a gate insulating film formed on a corresponding semiconductor region and first and second gate electrodes,
   wherein the first and second gate electrodes extend beyond or surround a portion of the corresponding semiconductor region.

19. The variable resistive memory device of claim 16, wherein the variable resistor and the semiconductor regions of the selection device have a pillar structure perpendicularly formed on a substrate,
   wherein the first and second common wirings are parallel to a main surface of the substrate with the pillar structure therebetween, and
   wherein the gate electrode extends between the first and second common wirings.

20. The variable resistive memory device of claim 19, wherein the gate electrode is formed as a spacer on side walls of the semiconductor regions.

21. The variable resistive memory device of claim 18, wherein a gate insulating film of the insulated gate structure surrounds a side wall of the pillar structure.

22. The variable resistive memory device of claim 16, wherein the semiconductor regions comprise any one of a PN diode structure, a PIN diode structure, or a metal-oxide-semiconductor field-effect-transistor (MOSFET) channel structure.

23. The variable resistive memory device of claim 12, wherein the variable resistor comprises a phase-change material, a switchable unipolar or bipolar conductive bridging material, a switchable polymer, a programmable metallization cell (PMC) material, an antifuse material, a fuse material, or a magnetoresistance effect material, or a combination thereof.

24. A variable resistive memory device comprising:
a plurality of memory cells arranged in a first direction and a second direction different from the first direction, each of the plurality of memory cells comprising a variable resistor and a selection device serially connected to the variable resistor;
first wiring lines electrically connected to first ends of the plurality of memory cells arranged in the first direction;
second wiring lines electrically connected to second ends of the plurality of memory cells arranged in the second direction; and
a common selection line coupled to the selection devices of the plurality of memory cells arranged in both of the first direction and second direction to apply a same voltage to the selection devices.

25. The variable resistive memory device of claim 24, wherein the selection device comprises:
semiconductor regions having different conductivity types and disposed adjacent to each other to provide a junction therebetween; and
at least one insulated gate structure coupled to any one semiconductor region,
wherein the insulated gate structure comprises a gate electrode coupled to the common selection line.

26. The variable resistive memory device of claim 25, wherein the insulated gate structure is to increase a magnitude of a current flowing through the semiconductor regions of the selection device, of a selected memory cell, by applying an electric field to a corresponding semiconductor region coupled to the insulated gate structure.

27. The variable resistive memory device of claim 25, wherein the gate electrode extends beyond or surrounds at least a portion of a corresponding semiconductor region.

28. The variable resistive memory device of claim 25, wherein the variable resistor and the semiconductor regions of the selection device have a pillar structure perpendicularly formed on a substrate,
wherein the first wiring lines and the second wiring lines are parallel to a main surface of the substrate with the pillar structure therebetween, and
wherein the gate electrode extends between the first wiring lines and the second wiring lines.

29. The variable resistive memory device of claim 28, wherein a gate insulating film of the insulated gate structure surrounds a side wall of the pillar structure.

30. The variable resistive memory device of claim 28, wherein the semiconductor regions comprise a PN diode structure, a PIN diode structure, or metal-oxide-semiconductor field-effect-transistor (MOSFET) channel structure.

31. The variable resistive memory device of claim 24, wherein the variable resistor comprises a phase-change material, a switchable unipolar or bipolar conductive bridging material, a switching polymer, a programmable metallization cell (PMC) material, an antifuse material, a fuse material, or a magnetoresistance effect material.

32. A method of driving a variable resistive memory device comprising a plurality of memory cells, each memory cell comprising a variable resistor and a selection device serially connected to the variable resistor and being arranged in a first direction and a second direction different from the first direction, wherein the selection device comprises a plurality of semiconductor regions and an insulated gate structure coupled to any one of the semiconductor regions, the method comprising:
applying a common reference voltage to first ends of the plurality of memory cells;
applying an operating voltage to second ends of the plurality of memory cells arranged in the first direction and including a selected memory cell, the operating voltage being selected so that a voltage difference between the common reference voltage and the operating voltage is less than a specified reference threshold voltage of the semiconductor regions;
applying a non-selection voltage to turn off the semiconductor regions to second ends of the plurality of memory cells arranged in the first direction and not including the selected memory cell;
applying a selection voltage to a corresponding insulated gate structure to swing a threshold voltage of the semiconductor regions of the plurality of memory cells arranged in the second direction and including the selected memory cell, so that the memory cells have a threshold voltage less than the specified reference threshold voltage; and
applying a non-selection voltage to a corresponding insulated gate structure so that the semiconductor regions of the memory cells arranged in the second direction and not including the selected memory cell have a threshold voltage equal to or greater than the specified reference threshold voltage.

33. The method of claim 32, wherein the semiconductor regions comprise a PN diode structure, a PIN diode structure, or a metal-oxide-semiconductor field-effect-transistor (MOSFET) channel structure.

34. The method of claim 32, wherein the variable resistor comprises a phase-change material, a switchable unipolar or bipolar conductive bridging material, a switchable polymer, a programmable metallization cell (PMC) material, an antifuse material, a fuse material, or a magnetoresistance material.

35. A method of driving a variable resistive memory device comprising a plurality of memory cells, each memory cell comprising a variable resistor and a selection device serially connected to the variable resistor and being arranged in a first direction and a second direction different from the first direction, wherein the selection device comprises semiconductor regions and first and second insulated gate structures, the semiconductor regions comprise first and second conductive regions providing a junction therebetween and an intermediate region disposed between the first and second conductive regions, and the first and second insulated gate structures are coupled to the intermediate region and are independently controlled, and respectively extend in the first direction and the second direction, the method comprising:
applying a common reference voltage to ends of the plurality of memory cells;
applying a common operating voltage to other ends of the plurality of memory cells, the common operating voltage being selected so that a voltage difference between the common reference voltage and the common operating voltage is less than a specified reference threshold voltage of the semiconductor regions;

applying a selection voltage to corresponding first and second insulated gate structures connected in the first direction and the second direction comprising the selected memory cell from among the plurality of memory cells to swing a threshold voltage of the semiconductor regions so that the plurality of memory cells have a threshold voltage equal to or less than the reference threshold voltage; and applying a non-selection voltage to first and second insulated gate structures other than the corresponding first and second insulated gate structures connected to the selected memory cell so that the non-selected memory cells, of the plurality of memory cells, have a threshold voltage equal to or greater than the specified reference threshold voltage.

36. The method of claim 35, wherein the semiconductor regions comprise a PN diode structure, a PIN diode structure, or a metal-oxide-semiconductor field-effect-transistor (MOSFET) channel structure.

37. The method of claim 35, wherein the variable resistor comprises a phase-change material, a switchable unipolar or bipolar conductive bridging material, a switchable polymer, a programmable metallization cell (PMC) material, an antifuse material, a fuse material, or a magnetoresistance effect material.

* * * * *